United States Patent
Fukuoka

[11] Patent Number: 6,157,050
[45] Date of Patent: Dec. 5, 2000

[54] OPTICAL MODULE AND LEAD FRAME FOR OPTICAL MODULE

[75] Inventor: Takashi Fukuoka, Kanagawa, Japan

[73] Assignee: Sumitomo Electric Industries, Ltd., Osaka, Japan

[21] Appl. No.: 09/308,779

[22] PCT Filed: Sep. 25, 1998

[86] PCT No.: PCT/JP98/04310

§ 371 Date: Jul. 9, 1999

§ 102(e) Date: Jul. 9, 1999

[87] PCT Pub. No.: WO99/16133

PCT Pub. Date: Apr. 1, 1999

[30] Foreign Application Priority Data

Sep. 25, 1997 [JP] Japan .................................. 9-260192

[51] Int. Cl.[7] ........................... H01L 27/15; H01L 31/12; H01L 33/00; H01L 31/0232; H01L 23/495

[52] U.S. Cl. ........................ 257/82; 257/99; 257/100; 257/432; 257/433; 257/448; 257/459; 257/676; 257/724; 257/787

[58] Field of Search ................................. 257/82, 88, 99, 257/100, 432, 433, 448, 459, 676, 724, 787

[56] References Cited

U.S. PATENT DOCUMENTS 5,587,605   12/1996   Ramsey et al. .
5,668,383   9/1997   Krieger .

FOREIGN PATENT DOCUMENTS 1-257361   10/1989   Japan .
3-43743   4/1991   Japan .
4-225271   8/1992   Japan .

Primary Examiner—David E. Graybill
Attorney, Agent, or Firm—McDermott, Will & Emery

[57] ABSTRACT

An optical module, including a plurality of optical devices and a plurality of circuit devices, which is suitable for a smaller size and a higher density, and a lead frame for the optical module are provided. The optical module comprises optical devices, circuit devices 30, 32 electrically connected to the optical devices; a lead frame mounting these devices on the same main surface; and a first encapsulating resin body 66, transparent to light processed by the optical devices, for encapsulating the optical devices. The lead frame has a single first die pad for mounting a plurality of optical devices; a plurality of second die pads 4, 6 each for mounting a circuit device; connection lead groups 40, 42, whose number is the same as that of the second die pads, having a plurality of connection leads 44, 48 for electrically connecting the optical devices mounted on the first die pad to the circuit devices mounted on the second die pads 4, 6; and wiring leads 50, 51 arranged so as to face the respective side faces of the second die pads 4, 6. In the optical module, the optical devices are connected to the wiring leads 50, 51 by way of the connection leads 44, 48.

11 Claims, 14 Drawing Sheets

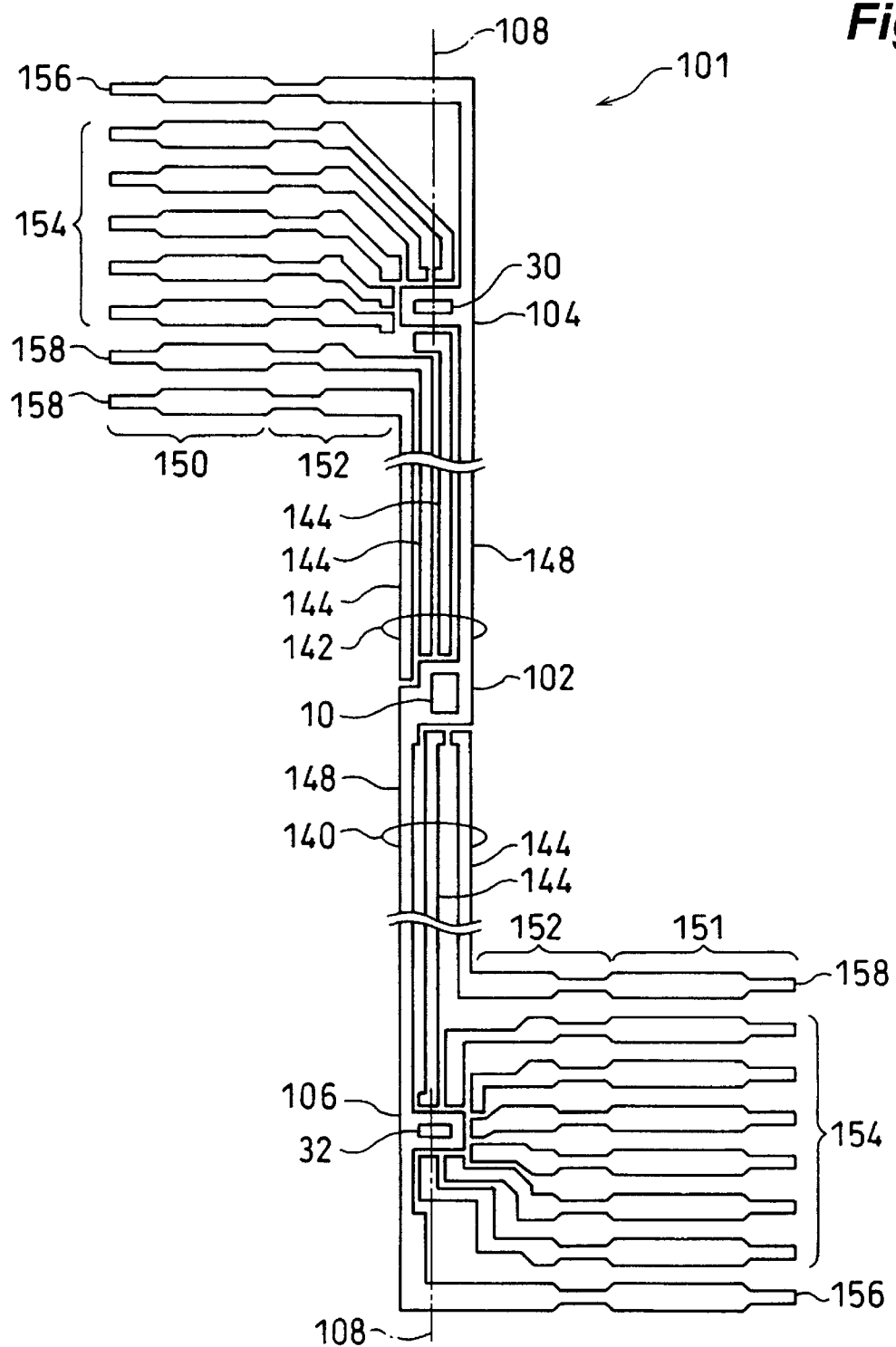

OPTICAL MODULE AND LEAD FRAME FOR OPTICAL MODULE

TECHNICAL FIELD

The present invention relates to an optical module and a lead frame for the optical module; and, in particular, to an optical module mounting a plurality of optical devices and a plurality of semiconductor circuit devices on the same lead frame, and the lead frame for the optical module.

BACKGROUND ART

Attempts have conventionally been made to attain the higher packing density of parts using a lead frame. As an example of such attempts, there is a technique disclosed in Japanese Patent Application Laid-Open No.1-257361. FIG. 15 is a sectional view of the semiconductor assembly disclosed in the above-mentioned publication. Referring to FIG. 15, semiconductor elements 404, 404' are mounted on the surfaces of two lead frames 401, 401', respectively. Electrode pads on the individual semiconductor elements 404, 404' are connected to their corresponding inner leads by bonding wires 403, 403', respectively. Then, with their rear faces faced to each other, the two lead frames 401, 401' are overlaid on each other with an insulating film 405 interposed therebetween. Subsequently, the semiconductor elements 404, 404' are encapsulated with an encapsulating resin body 402. Thereafter, the outer lead pins of the two lead frames are bent in one direction. Since the outer lead pins of the two respective lead frames are bent with their different lengths, they would not come into contact with each other.

DISCLOSURE OF INVENTION

In the semiconductor assembly having such a configuration, an electric connection between the two lead frames is made via an outer lead. Additional outer lead pins are required for connecting the respective semiconductor elements mounted on the different lead frames to each other, whereby the number of the outer lead pins cannot be reduced even when this configuration is employed. It cannot improve the packing density of the semiconductor assembly.

If such a configuration is applied to an optical module such that a transmitting unit and a receiving unit are mounted on the two lead frames, respectively, and are integrally encapsulated with resin, then the signal light emitting and receiving faces of the transmitting and receiving units are located back to back, whereby their optical couplings cannot be made in the same direction.

On the other hand, in a module in which a light-receiving element or light-emitting element and a circuit element are mounted to a single lead frame, the light-receiving element and a preamplifier have been separately encapsulated with resin to make a light-receiving module, or the light-emitting element and its driver IC have been separately encapsulated with resin to make a light-emitting module. In order to make a transmitter/receiver module, it is necessary to assemble a module for a receiving portion and a module for a transmitting portion, so as to produce the transmitter/receiver module. As the distance between the light-emitting element and the light-receiving element becomes shorter, the circuit element portion must be made smaller depending on this distance, whereby it is hard to secure an area for mounting the circuit elements.

When a main amplifier, a clock data reproducing circuit, and the like, in addition to the preamplifier, are mounted to the circuit element mounting portion, the mounting area for such additional circuit devices cannot be secured.

Therefore, it is an object of the present invention to provide an optical module, having a plurality of optical semiconductor devices and a plurality of circuit devices with their emitting and receiving faces faced to one direction, which is suitable for a smaller size and a higher density; and a lead frame for the optical module.

The present invention is configured as follows.

The optical module in accordance with the present invention comprises an optical device which is one of a semiconductor light-receiving device and a semiconductor light-emitting device, a semiconductor circuit device, a lead frame, and a first encapsulating resin body. The semiconductor light-receiving device is provided for receiving an optical signal, converting thus received optical signal into an electric signal, and outputting thus obtained electric signal. The semiconductor lightemitting device is provided for receiving an electric signal, converting thus received electric signal into an optical signal, and emitting thus obtained optical signal. The semiconductor circuit device, electrically connected to the optical device, is provided for processing the electric signal. The lead frame is provided for mounting the optical devices and the semiconductor circuit device on a surface thereof. The first encapsulating resin body, transparent to signal light processed by the optical device, encapsulates the optical devices. The lead frame has a single first die pad for mounting a plurality of optical devices thereon; a plurality of second die pads for mounting the semiconductor circuit devices thereon; connection lead groups; and a wiring lead arranged so as to face a side of the second die pad. The number of the connection lead groups is identical to that of the second die pads. Each of the connection lead groups have a plurality of connection leads, and has one end arranged so as to face one side of the first die pad and the other end arranged so as to face one side of the second die pad. The connection lead groups electrically connect the optical devices mounted on the first die pad to the semiconductor circuit devices mounted on the second die pads. The optical devices can be electrically connected to a wiring lead by way of a connection lead.

The plurality of optical devices are mounted on the single first die pad, whereby the distance between the optical devices can be reduced, and the emitting face and receiving face for the optical signal can be faced to the same direction. The optical module having a resin-encapsulated optical device portion can be provided. Since the lead frame mounted with the optical devices is provided with a plurality of second die pads on which the respective circuit devices are mounted, an area for mounting a plurality of circuit devices can be secured. Further, the optical devices mounted on the first die pad can be directly and electrically connected to the circuit devices mounted on the second die pads by connection lead groups. The number of the connection lead groups is identical to that of the second die pads. Each of the connection lead group comprises a plurality of connection leads, and has one end provided so as to face one side of the first die pad and the other end provided so as to face one side of the second die pad. Consequently, the number of wiring leads can be reduced.

The optical module in accordance with the present invention can be configured such that the lead frame has two second die pads, and the respective connection lead groups are provided so as to face a pair of two opposite sides of the first die pad, and each connection lead group has a bent portion at a predetermined position at which it is bent substantially at right angles so that the respective rear faces opposite to the mounting surfaces of the second die pads are oriented to face to each other.

As each connection lead is thus bent at a predetermined position so that the rear faces are faced to each other, i.e., inward, the two-dimensional size of the optical module can be reduced.

In the optical module in accordance with the present invention, the first encapsulating resin body can have light collecting means provided on the optical axis of the signal light associated the optical devices.

When the encapsulating resin body thus has the light-collecting means on the optical axes of the signal light, it is not necessary to provide the external light-collecting means and the optical module can be also provided with the optical devices and the light-collecting means aligned to each other.

The optical module in accordance with the present invention can further comprise a second encapsulating resin body for integrally encapsulating the semiconductor circuit devices mounted on the respective second die pads.

When the circuit devices are thus integrally encapsulated with an encapsulating resin, then an optical module reduced in its size can be provided.

The optical module in accordance with the present invention can further comprise second encapsulating resin bodies for separately encapsulating two semiconductor circuit devices mounted on the respective second die pads.

When the circuit devices are thus separately encapsulated with encapsulating resins, the flexibilty in the arrangement of the circuit devices within a light-emitting module can be enhanced.

In the optical module in accordance with the present invention, the optical devices can be provided on the first die pad such that the optical axes of the optical devices is conformed to the core interval of adjacent optical fibers in a ribbon fiber cable.

When the optical axes of the optical devices thus is conformed to the core interval of adjacent optical fibers in the ribbon fiber cable, the portion required for being connected with the fiber cable can be made smaller.

The lead frame for an optical module in accordance with the present invention is provided so as to mount a semiconductor circuit device and an optical device thereon which is at least one of a semiconductor light-receiving device and a semiconductor light-emitting device. The semiconductor light-receiving device receives an optical signal, converts thus received optical signal into an electric signal, and outputs thus obtained electric signal. The semiconductor light-emitting device receives an electric signal, converts thus received electric signal into an optical signal, and emits thus obtained optical signal. The semiconductor circuit device, electrically connected to the optical device, processes the electric signal. The lead frame comprises a single first die pad; a plurality of second die pads; connection lead groups; and a plurality wiring leads. The single first die pad is provided so as to mount the optical device. The plurality of second die pads are provided so as to mounting the semiconductor circuit devices. The number of the connection lead groups is identical to that of the second die pads. Each connection lead group has a plurality of connection leads. The connection lead group has one end arranged so as to face one side of the first die pad and the other end arranged so as to face one side of the second die pad. The connection lead groups electrically connect the optical devices mounted on the first die pad to the semiconductor circuit devices mounted on the second die pads. The plurality of wiring leads face a side of the second die pad and are arranged so as to electrically connect the semiconductor circuit devices and the optical devices to outside.

The first single die pad which can mount a plurality of optical devices is provided, whereby the reduced arrangement of the optical devices to be mounted thereon can be attained, and it is possible to provide a lead frame in which the optical signal emitting and receiving faces of the optical devices can face to the same direction. Since the lead frame mounted with the optical devices is provided with a plurality of second die pads which can be mounted with the circuit devices, it is possible to provide a lead frame which can secure an area for mounting a plurality of circuit devices. Further, the lead frame is provided with connection lead groups, the number of which is identical to that of the second die pads. Each of the connection lead groups comprises a plurality of connection leads. Each of the connection lead groups have one end arranged so as to face one side of the first die pad and the other end arranged so as to face one side of the second die pad. Therefore, it is possible to provide a lead frame in which the optical devices mounted on the first die pad can be directly and electrically connected to the circuit devices mounted on the second die pads. Consequently, the number of wiring leads can be reduced.

The lead frame in accordance with the present invention can be configured such that two second die pads are provided, the respective connection lead groups have portions to be bent substantially at right angle and are arranged so as to face a pair of two opposite sides of the first die pad, and the second die pads face respective plains containing the two sides of the first die pad and are arranged on an axis while the first die pad is sandwiched therebetween.

In such a lead frame, each connection lead can be bent at a predetermined position substantially at the right angle, so that the respective rear faces opposite to the mounting surfaces of the two second die pads are oriented to face each other, i.e., inward. As a consequence, it is possible to provide a smaller optical module lead frame in two-dimensional size.

The lead frame in accordance with the present invention can be configured such that each second die pad is provided with a reference axis extending through both one side of the second die pad facing the connection lead group and the opposite side paired therewith, and the wiring leads are arranged so as to be extended to left and right sides of the reference axis. Also, it can be configured such that each second die pad is provided with a reference axis extending through both one side of the second die pad facing the connection lead group and the opposite side paired therewith, the wiring leads are arranged so as to face one second die pad in the left and right sides of the reference axis, and the wiring leads are arranged so as to face the other second die pad in the side face of the left and right sides of the reference axis. Further, the wiring leads can be arranged so as to face the sides of the second die pads opposite to the sides thereof on which the second die pads face the first die pad.

Thus, drawing the wiring leads in predetermined directions can provide an optical module lead frame which is suitable for high-density packaging and appropriate for connecting with an optical waveguide.

BRIEF DESCRIPTION OF THE DRAWINGS

FIG. 4A is a perspective view of an optical module encapsulated with a molding resin, whereas

FIG. 5A is a perspective view of an optical module encapsulated with an encapsulating resin, whereas

FIGS. 6A and 6B are sectional views of optical device portions for light-collecting means, whereas

FIG. 7 is a plan view of a major portion of the optical module lead frame in accordance with a second embodiment;

FIG. 8A is a perspective view of an optical module encapsulated with a molding resin, whereas

FIG. 9A is a perspective view of an optical module encapsulated with a molding resin, whereas

FIG. 11A is a perspective view of an optical module encapsulated with a molding resin, whereas

FIG. 12A is a perspective view of an optical module encapsulated with a molding resin, whereas

BEST MODES FOR CARRYING OUT THE INVENTION

In the following, the present invention will be explained with reference to the accompanying drawings. Parts identical to each other will be referred to with identical numerals if possible, without repeating their overlapping explanations.

(First Embodiment)

Figure 1:
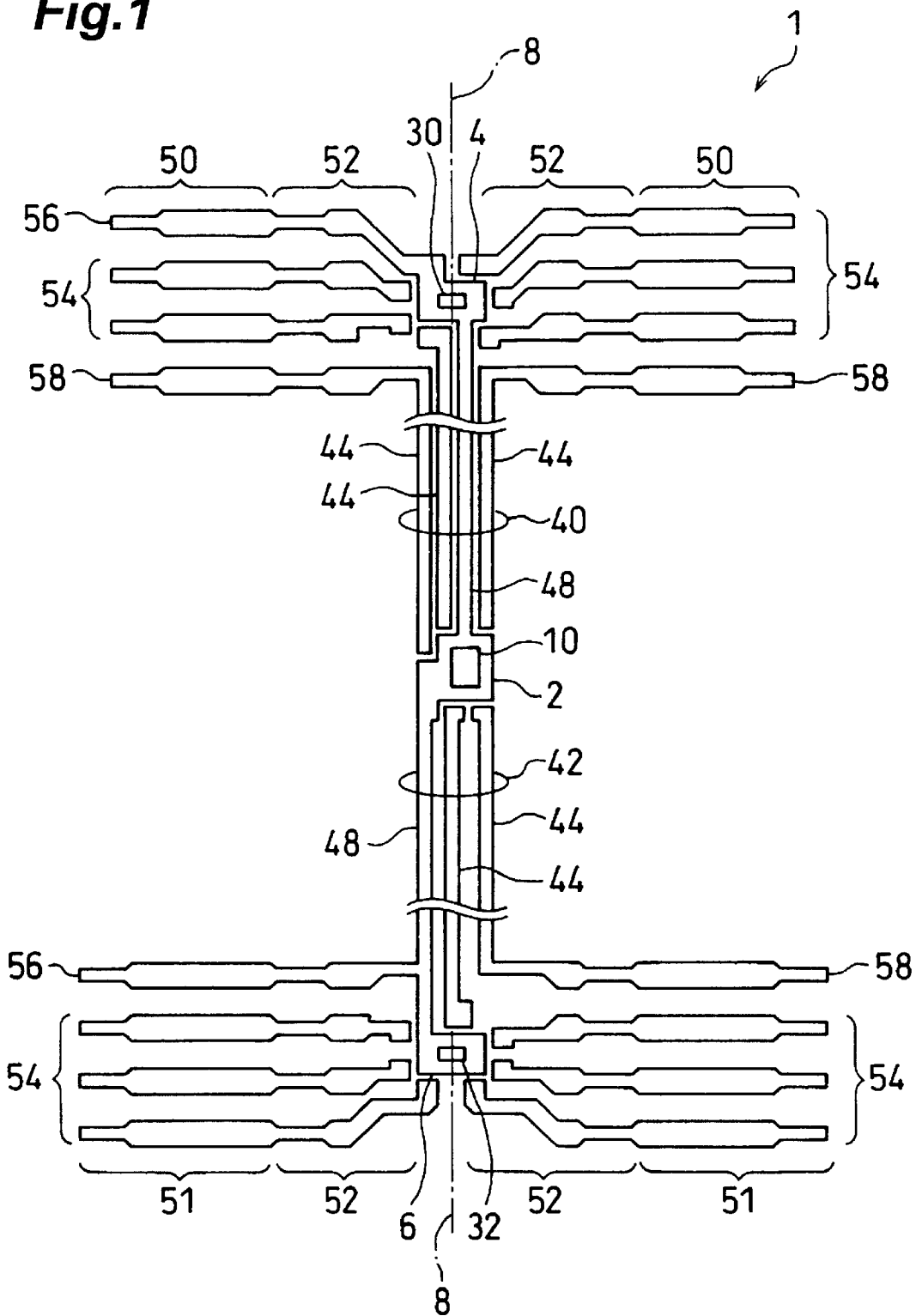
FIG. 1 is a plan view of a principal portion of the optical module lead frame in accordance with a first embodiment.

FIG. 1 is a plan view of a main portion of the lead frame in accordance with the first embodiment. Referring to FIG. 1, the lead frame 1 comprises a planar first die pad 2, made of electric conductive material, located at the center thereof; and two planar second die pads 4, 6, each made of electric conductive material, disposed on both sides of the first die pad 2. The three die pads 2, 4, 6 are included in the same plane and are arranged along a single line. One main surface of the lead frame 1 includes the mounting surface of the first die pad 2 and the mounting surfaces of the second die pads 4, 6. A plurality of optical devices are mounted on the mounting surface of the first die pad 2, whereas semiconductor circuit devices (hereinafter referred to as circuit devices) 30, 32 are mounted on the mounting surfaces of the second die pads 4, 6. The circuit devices 30, 32 are electrically connected to the optical devices, thereby processing electric signals associated with the optical devices. Here, each of the first die pad 2 and the second die pads 4, 6 has substantially a rectangular or square form.

Mounted on the first die pad 2 are a plurality of optical devices, each of which is one of a semiconductor light-receiving device (hereinafter referred to as light-receiving device) and a semiconductor light-emitting device (hereinafter referred to as light-emitting device). The light-receiving device can receive an optical signal, converts thus received optical signal to an electric signal, and outputs thus obtained electric signal. The light-emitting device receives an electric signal, converts thus received electric signal to an optical signal, and emits thus obtained optical signal.

Figure 2:
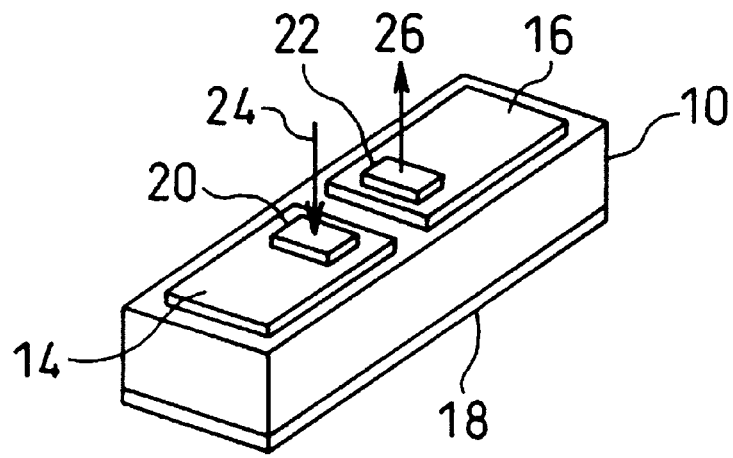
FIG. 2 is a perspective view of a die capacitor mounted with optical devices.

FIG. 2 is a perspective view of a light-receiving device 20 and a light-emitting device 22 mounted on a die capacitor 10. In FIG. 2, the light-receiving device 22 is mounted on an electrode 14 formed on the upper face of the die capacitor 10 shaped like a rectangular parallelepiped form, whereas the light-emitting device 22 is mounted on an electrode 16 formed on the upper face of the die capacitor 10. The die capacitor 10 mounted with the light-receiving device 20 and the light-emitting device 22 is mounted on the first die pad 2 with its rear-side electrode 18 faced to the mounting surface. As a consequence, the light-receiving device 20 and the light-emitting device 22 can be electrically separated from the first die pad 2. Also, the light-receiving device 20 and the light-emitting device 22 are mounted such that both of their optical axes 24, 26 become substantially perpendicular to the mounting surface of the die capacitor 10.

The electric power to the light-receiving device 20 and the electric power to light-emitting device 22 are supplied by way of the respective electrodes 14, 16 formed with these devices. For example, the power to the light-receiving device 20 is supplied by an electrode pad formed on the surface thereof and connected to the electrode 14 via a wire, whereas the electric power to the light-emitting device 22 is supplied from the rear side of the light-emitting device. After the devices 20, 22 are mounted, the respective electrode pads on the devices, the first die pad, and their corresponding connection leads 44 are connected to each other by bonding wires.

In the example shown in FIG. 2, the light-receiving device 20 can be a surface receiving type light-receiving device, whereby it receives signal light arriving at the receiving surface side of the light-receiving device 20, e.g., the signal light arriving along the arrow 24. The surface receiving type light-receiving device includes a photodiode. Also, the light-emitting device 22 can be a surface emission type light-emitting device, whereby the light-emitting device 22 emits signal light from the surface, for example, along the direction of the arrow 26. The surface emission type light-emitting device includes a light-emitting diode.

Figure 3:
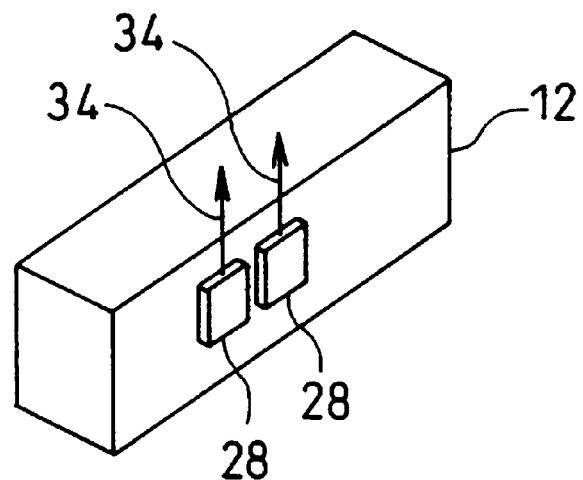
FIG. 3 is a perspective view of a sub-mount mounted with optical devices.

In place of the die capacitor 10, a sub-mount 12 can be used. FIG. 3 is a perspective view of a sub-mount. As shown in FIG. 3, the sub-mount 12 shaped like a rectangular parallelepiped form can be mounted on the first die pad 2, and the light-emitting devices 28 can be mounted thereon with their rear faces facing one side of the sub-mount 12. Also, the light-emitting devices 28 can be mounted on a side of the sub-mount 12 with their rear faces directed to the side, and the sub-mount 12 mounted with the light-emitting devices 28 can further be mounted on the first die pad 2. The light-emitting devices 28 are mounted such that their optical axes 34 extend parallel along the mounting side of the sub-mount 12. In the example as shown in FIG. 3, each of the light-emitting devices 28 is an edge emission type light-emitting device, whereby they are preferably mounted such that their respective optical axes 34 are parallel to each other and substantially perpendicular to the mounting surface of the die pad 2. As a consequence, a plurality of light-emitting devices 28 with optical axes aligned to each other can be provided. For example, the edge emission type device includes a semiconductor laser.

In the examples of FIGS. 2 and 3 mentioned above, the light-receiving device 20 and the light-emitting devices 22, 28 having substantially a rectangular or square planar form are employed. Although explained are the case where one light-receiving device 20 and one light-emitting device 22 are mounted and the case where two light-emitting devices 28 are mounted, the present invention encompasses any combination of each or a plurality of these optical devices (light-receiving device and light-emitting device). For example, a plurality of light-receiving devices can be mounted. The following explanations will be concerned with a case where one light-receiving device 20 and one light-emitting device 22 are mounted on the first die pad.

In FIG. 1, the circuit devices 30, 32 are mounted on the mounting surfaces of the second die pads 4, 6 with their rear faces faced to the respective mounting surfaces. The second die pad 4 is mounted with the circuit device 30 and the like associated with the light-receiving device 20 mounted on the first die pad 2. Such a circuit device includes a main amplifier, a data recovery circuit, a clock extraction circuit, a bypass capacitor, a coupling capacitor, and the like. These devices are arranged at their predetermined positions and are electrically connected to the die pad 4 and inner leads 52 and among these individual devices by bonding wires (not illustrated). The second die pad 6 is mounted with the circuit device 32 and the like associated with the light-emitting device 22 mounted on the first die pad 2. Such a circuit device includes a light-emitting device driving circuit, a bypass capacitor, a semi-fixed resistor for adjusting bias current, and the like. These devices are arranged at their predetermined positions and are electrically connected to the die pad 6 and the inner leads 52 and among the individual devices by bonding wires (not illustrated).

Referring to FIG. 1, in addition to the first and second die pads 2, 4, 6, the lead frame 1 has two group of connection leads 40, 42 and wiring leads 54, 56, 58. The first group of connection leads 40 is arranged such that one end thereof faces one side of the substantially rectangular first die pad 2 (on the upper side of the first die pad 2 in the drawing), and the other end thereof faces one side of the second die pad 4 (on the lower side of the second die pad 4 in the drawing). The second group of connection leads 42 is arranged such that one end thereof faces one side of the substantially rectangular first die pad 2 (on the lower side of the first die pad 2 in the drawing), and the other end thereof faces one side of the second die pad 6 (on the upper side of the second die pad 6 in the drawing). The first and second connection lead groups 40, 42 have a plurality of conductive connection leads 44, 48 for electrically connecting the optical devices mounted on the first die pad 2 to the circuit devices mounted on the second die pads 4, 6, and are provided in the planes containing the first die pad 2 and the corresponding second die pads 4, 6. Since the connection lead groups 40, 42 are provided so as to connect the second die pads 4, 6 to the first die pad 2, the number of the groups is identical to that of the second die pads 4, 6.

The second die pads 4, 6 are arranged such that the first die pad 2 is sandwiched therebetween, and the first die pad 2 and the second die pads 4, 6 are arranged along a single line. The connection lead groups 40, 42 are disposed so as to face a pair of opposed sides of the first die pad 2, respectively, whereas the second die pads 4, 6 face the respective surfaces including the two sides of the first die pad 2. The connection leads in the groups 40, 42 linearly extend from a pair of opposed sides of the first die pad 2 perpendicularly to these sides (in vertical directions in the drawing), respectively, so as to reach the respective sides of the second die pads 4, 6. The connection lead groups 40, 42 can linearly extend from a pair of opposed sides of the first die pad 2, respectively, while forming a predetermined angle with their corresponding sides, so as to reach the respective side faces of the second die pads 4, 6.

As shown in FIG. 1, the connection leads 44 are disposed so as to be faced to their corresponding die pads, and are connected, by bonding wires (not illustrated), to the devices mounted on the die pads, or to the wiring leads.

The connection leads 44, 48, provided so as to connect the first die pad 2 mounted with the light-receiving device 20 to the second die pad 4 mounted with the circuit device to be connected to the light-receiving device 20, include at least three lines consisting of a preamplifier output line, a preamplifier power line, and a ground line. If the preamplifier power supply is to be separated from the power supply for the light-receiving device 20, then four lines are necessary. FIG. 1 shows a lead frame with four lines. The connection lead group 40 consists of four connection leads in which three connection leads 44 are allocated to the preamplifier output line, preamplifier power line, and light-receiving device power line, respectively, and one grounding line is added thereto.

The first die pad 2 can be mounted with a preamplifier (not illustrated) which is provide so as to effect a current/voltage conversion of an electric signal from the light-receiving device 20 and amplifying the resulting signal. In this case, it is preferred that the semiconductor device including the preamplifier is directly mounted on the mounting surface of the first die pad 2 with its rear face faced to the mounting surface. The electrode pad on the semiconductor device, the die pad 2, and their corresponding connection leads 44 are electrically connected to each other by bonding wires (not illustrated).

The connection leads 44, 48, provided so as to connect the first die pad 2 mounted with the light-emitting device 22 to the second die pad 6 mounted with the circuit device to be connected to the light-emitting device 22, include at least two lines consisting of a light-emitting device power line and a signal line. FIG. 1 shows a lead frame with three lines. Namely, the connection lead group 42 consists of three leads in which two connection leads 44 are allocated to the light-emitting device power line and signal line, and one grounding line is added thereto.

Together with the light-emitting device 22, its driving circuit device can be mounted on the first die pad 2. This configuration is determined while considering both the influence on heat generation of the driving circuit and the noise reduction effect achieved when the driving circuit and the light-emitting device 22 are placed close to each other. If the driving circuit device is mounted on the first die pad 2, it will be necessary to increase the number of connection leads as required.

The number of connection leads 44 would vary depending on the device mounted on each die pad.

In FIG. 1, four leads composed of the wiring leads 54, 56, 58 are arranged at each of two sides of respective second die pad 4, 6. The second pads 4, 6 are provided with a reference axis 8 vertically extending through both the sides of the second die pads facing their corresponding connection lead groups and the opposite sides paired therewith. The wiring leads 54, 56, 58 are arranged on both left and right sides of the reference axis 8 and are oriented outward with respect to the reference axis 8. Each of the wiring leads 54, 56, 58 can be composed of an inner lead portion 52 and an outer lead portion 50, 51. Some of the inner leads 52 are arranged so as to face sides of the second die pads 4, 6 and are connected with the outer leads 50, 51, and others are arranged so as to be connected with the connection leads 44, 48. The outer leads 50, 51 are directed perpendicularly to both sides of the reference axis 8. They are arranged in so-called DIP. In the outer leads 50, 51, the outer leads 50 associated with the second die pad 4 are shorter than the outer leads 51 associated therewith the second die pad 6.

The wiring leads 54 are signal lines and power lines for the circuit devices mounted on the second die pads 4, 6, the wiring leads 56 are the grounding lines, and the wiring leads 58 are signal lines and power lines for the optical devices mounted on the first die pad 2.

The light-receiving device 20 and the light-emitting device 22 are coupled to the circuit devices and the like via wiring leads by way of the connection leads 44, 48, or finally electrically coupled to the outer leads 50, 51 by way of the connection leads 44, 48.

Figure 4A:
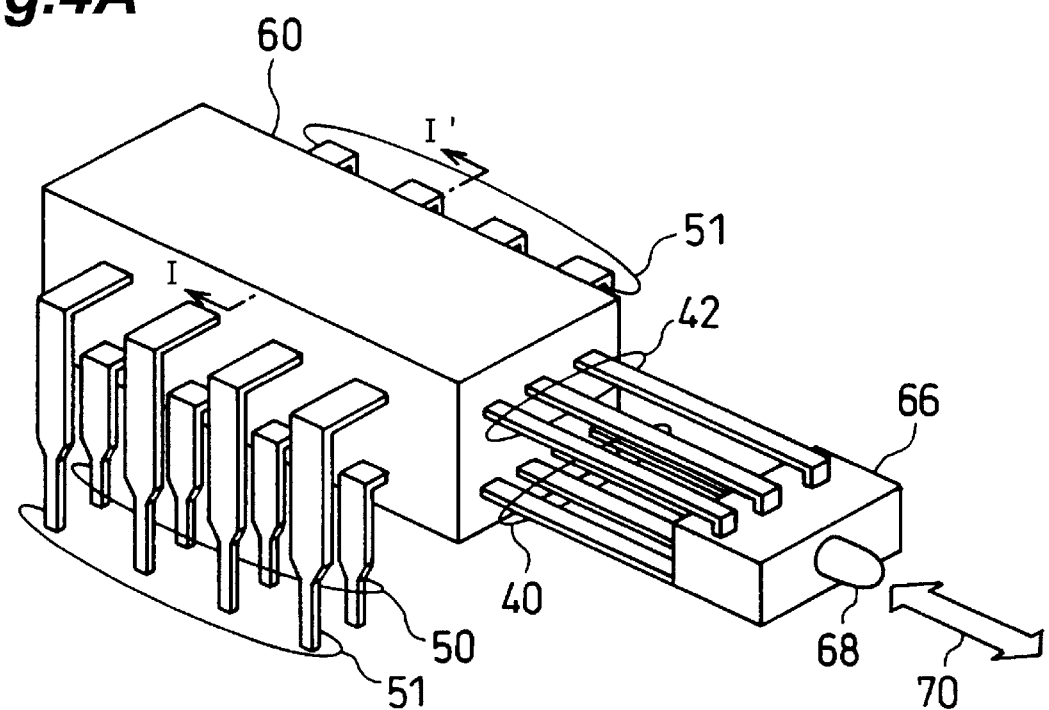
Figure 4B:
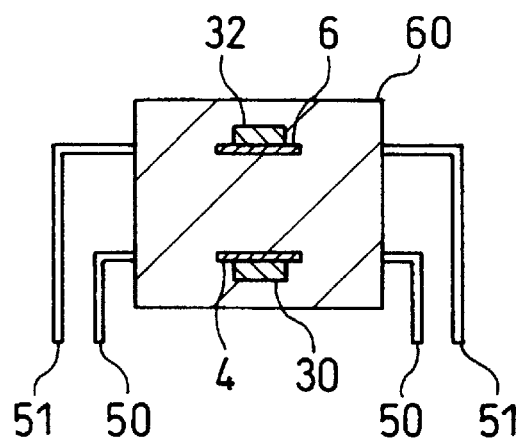
FIG. 4B is a sectional view taken along the section I–I' indicated in FIG. 4A.
Figure 5A:
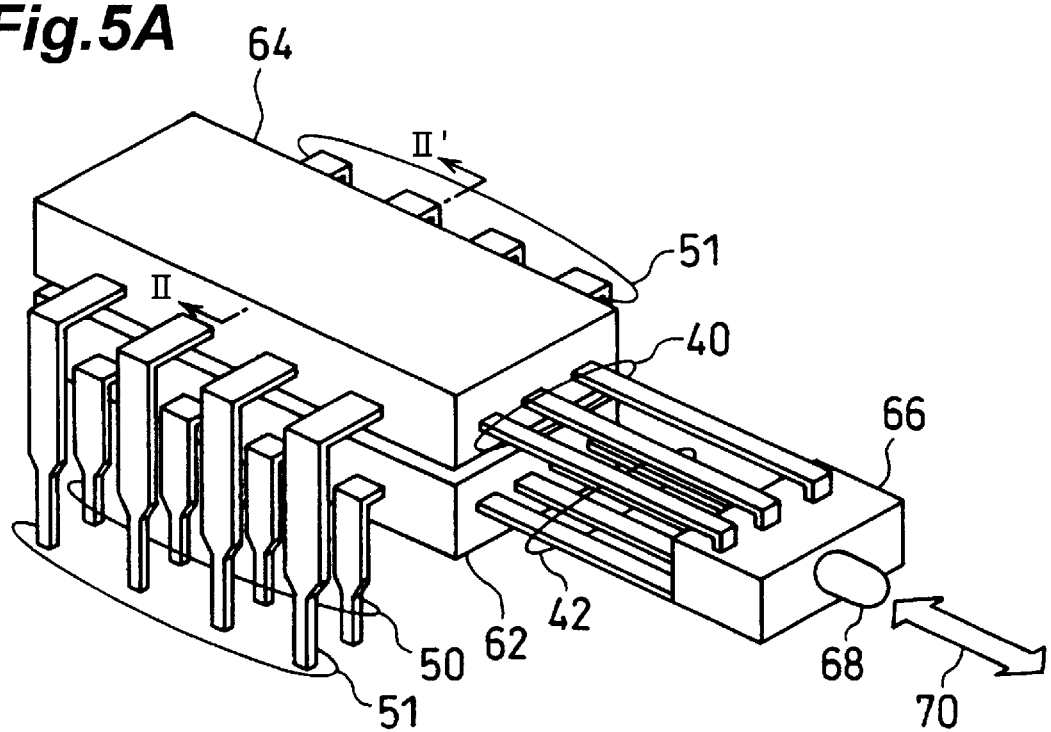
Figure 5B:
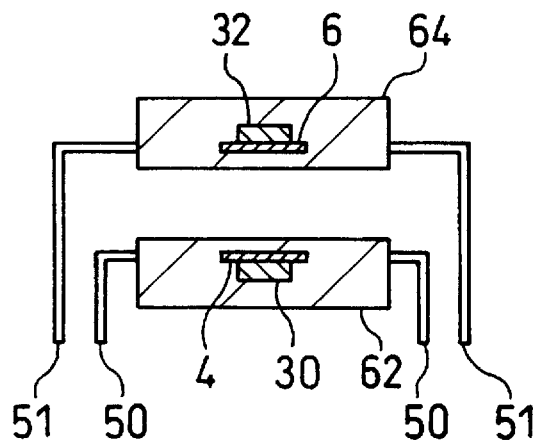
FIG. 5B is a sectional view taken along the section II–II' indicated in FIG. 5A.

FIGS. 4A and 5A are perspective views each showing an optical module when the light-receiving device 20, light-emitting device 22, circuit device, and the like are mounted on their corresponding die pads 2, 4, 6 and are encapsulated with resin. FIG. 4B is a vertical sectional view taken along the section I–I' indicated in FIG. 4A, whereas FIG. 5B is a vertical sectional view taken along the section II–II' indicated in FIG. 5A. In FIGS. 4B and 5B, the outer leads 50, 51 in each cross section are also illustrated in order to clarify the positional relationship between the die pads 4, 6 and the outer leads 50, 51.

Referring to FIGS. 4A and 5A, the first die pad 2, light-receiving device 20, and light-emitting device 22 are integrally encapsulated with an encapsulating resin body 66. As a consequence, an optical module with the optical device resin-encapsulated therein can be provided. Resin employed for the encapsulating resin body 66 is transparent to the wavelength of signal light associated the light-receiving device 20 and light-emitting device 22. Also, on the optical axis 70 of signal light associated with the light-receiving device 20 and light-emitting device 22, a light-collecting means 68 for signal light, e.g., condenser lens, is formed by the form of the encapsulating resin body 66. As a consequence, it is not necessary to provide an external light-collecting means, and it is possible to provide an optical module including the optical devices and the light-collecting means arranged on the common optical axis. Examples of the form of the light-collecting means include a convex form (the form of one surface of a convex lens) directed outward on the encapsulating resin body 66. A plurality of optical devices, e.g., two optical devices consisting o f the e light-receiving d device 20 and the light-emitting device 22, can be provided with their individual condenser lenses or a single condenser lens. Such a condenser lens 68 can be formed when a molding die shaped into a predetermined inner form is filled with resin. Here, for the alignment of the optical axis with a waveguide, it is preferred that the interval o f the optical axes of a plurality of optical devices be set to the e firament interval of a two-firament connector, Multi-MT connector, LC connector and the like, or the core interval of optical fibers in ribbon fiber cable. Since the core interval of the two-core LC connector is, for example, 6.35 mm, and the light-emitting device and the light-receiving device can be packaged without difficulty when the present invention is applied thereto.

Referring to FIG. 4A, the second die pads 4, 6 and the circuit devices and the like are integrally molded with an encapsulating resin body 60 shaped like a rectangular parallelepiped form. When circuit device portions are integrally encapsulated, then a smaller optical module in size can be provided. Referring to FIG. 5A, the second die pad 4 and the circuit device 30 and the like mounted thereon are molded with a single encapsulating resin body 62 shaped like a rectangular parallelepiped form, whereas the second die pad 6 and the circuit device 32 and the like mounted thereon are molded with a different single encapsulating resin body 64. When circuit device portions are separately encapsulated, then the flexibility for arranging the circuit device portion in the light-emitting module can be enhanced. While thus encapsulated two semiconductor device are completely overlaid on each other with a predetermined distance therebetween in the vertical direction in FIG. 5A, there are cases where they do not or partly overlap each other depending on angles formed between the side face of the first die pad 2 facing the connection lead group 40, 42 and the extending direction of the connection lead group 40, 42. The predetermined distance is determined by the distance between the connection lead groups 40, 42 for connection with the optical device portions, i.e., the bent part position of the connection lead portions. The encapsulating resin that is not transparent to the signal light of the optical devices is preferably used. In this case, noise light is prevented from reaching the circuit devices mounted on the second die pads 4, 6 and thereby causing them to malfunction.

The lead frame 1 shown in FIGS. 4A and 4B and FIGS. 5A and 5B has a bent portion bent substantially at the right angle at a position near each side of the first die pad 2, whereby the rear faces opposite to the mounting surfaces of the second die pads 4, 6 are oriented inward with respect to each other. Namely, the rear faces of the second die pads 4, 6 face each other (FIGS. 4B, 5B). The connection lead group 40 and the second die pad 4 are included in one plane. The connection lead group 42 and the second die pad 6 are included in another plane. These planes are substantially parallel to each other, while each of them is orthogonal to the plane including the mounting surface of the first die pad 2.

Therefore, in order for the optical module to have the configuration shown in FIG. 4A, it is necessary that the lead frame 1 be processed into a predetermined form before encapsulation. In order for the optical module to have a form shown in FIG. 5A, the lead frame 1 can be shaped either before or after encapsulation.

The encapsulating resin bodies 60, 62, 64 can be formed together with the encapsulating resin body 66. In this manner, the number of encapsulating steps can be reduced. Here, the encapsulating resin suitable for the optical devices should be used.

In the outer leads 50, 51, the outer leads 50 associated with the second die pad 4 are shorter than the outer leads 51 associated with the second die pad 6. If the position of the bent part of the shorter outer leads is located outside the position of the bent part of the longer outer leads, then the ends of the shorter outer leads are placed on the inner side, and the ends of the longer outer leads are placed on the outer side, so that the lead ends align in two rows on each side. Therefore, even when the outer leads 50 and 51 are bent in the same direction after encapsulation, the outer leads arranged in the same side would not come into contact with each other. The outer lead end positions substantially are also aligned with each other. Thus, the alignment makes it easy for the optical module to be mounted onto a printed circuit board or the like.

As explained in the foregoing, the optical module shown in FIG. 4A is configured such that, when a first plane is defined as a plain containing the mounting surface of the first die pad 2 mounted with a plurality of optical devices, a second plane is also defined as a plain containing the mounting surface of the second die pad 4 mounted with a circuit device electrically connected to at least one optical device, and a third plane is defined as a plain containing the mounting surface of the third die pad 6 mounted with a circuit device electrically connected to at least one optical device, then in terms of the relationship among the first, second, and third plains, the second plane and the third plane are substantially parallel to each other, the second and third planes are substantially orthogonal to the first plane, and the rear face of the second die pad 4 and the rear face of the second die pad 6 face each other. The first die pad 2 and the optical devices are encapsulated with the encapsulating resin body 66, whereas the second die pads 4, 6 and the circuit devices 30 and 32 are encapsulated with the encapsulating resin body 60. The connection lead groups 40, 42 extend from the encapsulating resin body 66 while being contained within the first plane. The groups 40, 42 are bend substantially at the right angle at the respective positions where the groups 40, 42 intersect the second and third planes, so that the second and third planes can contain the groups 40, 42, respectively, and reach one side of the encapsulating resin body 60 so as to be connected with the inner leads. The outer leads 50, 51 are contained within the second and third planes, respectively, extend both leftward and rightward orthogonal to the extending directions of the connection lead groups 40, 42, and then bend substantially at the right angle, all in the same direction, at their respective predetermined positions near their corresponding sides of the encapsulating resin body 60. The optical module shown in FIG. 5A has a configuration similar to that of FIG. 4A except that the second die pad 4 and the circuit device 30 are molded with the encapsulating resin body 62 and the second die pad 6 and the circuit device 32 are molded with the encapsulating resin body 64.

Figure 6A:
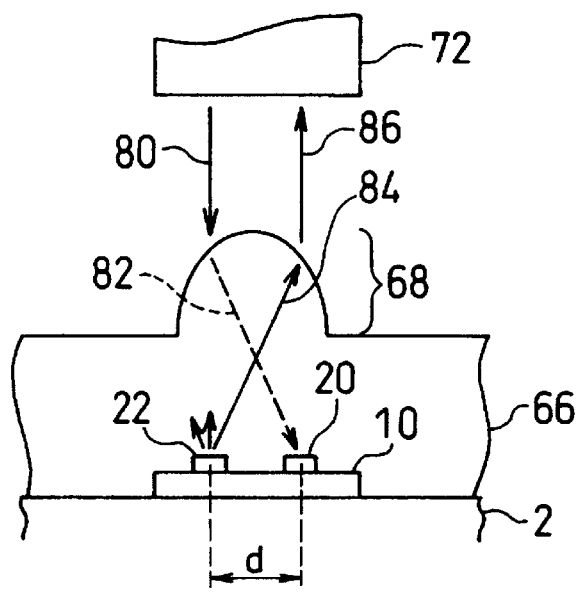

FIG. 6A is a sectional view of the encapsulating resin body 66 (FIGS. 4A and 4B and FIGS. 5A and 5B), and shows a cross section including the light-collecting means 68 as well as the light-receiving device 20 and the light-emitting device 22. The optical module is optically connected with an optical waveguide, e.g., a ribbon fiber cable 72. FIG. 6C shows a cross section of such a fiber cable 72. In the example of FIG. 6C, the ribbon fiber cable 72 is configured such that two optical fibers 74 are disposed along a reference axis with a predetermined core interval d, whereas the peripheries of the ribbon fibers 72 are coated with a resin body 76.

In FIG. 6A, the ribbon fiber cable 72 is disposed on the optical axis of the light-collecting means 68. The respective optical axes of the light-receiving device 20 and light-emitting device 22 are provided with the distance d therebetween. The light 80 emitted from the optical fiber 72 is collected by the light-collecting means 68 onto the surface of the light-receiving device 20, whereby the receiving surface of the light-receiving device 20 receives thus collected light 82. The light 84 emitted from the emitting surface of light-emitting device 22 is collected by the light-collecting means 68, and thus collected light 86 is guided to the optical fiber. The respective optical axes of the light-receiving device 20 and light-emitting device 22 can be arranged with the distance d behinded the light-collecting means 68.

Figure 6B:
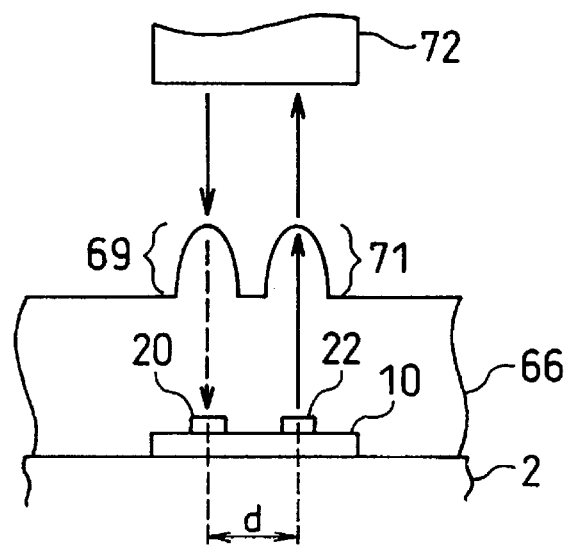
Figure 6C:
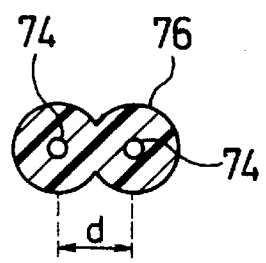
FIG. 6C is a sectional view of a two-firament optical fiber cable.

In FIG. 6B, each device is provided with one light-collecting means, i.e., a light-collecting means 69 is provided for the light-receiving device 20, and a light-collecting means 71 is provided for the light-emitting device 22. In this example, the distance between the respective optical axes of the light-collecting means 69, 71 is d, which coincides with the core interval of the ribbon fiber cable 72. This configuration will not be explained further because it is the same as that of FIG. 6A except that the respective light beams are collected by their corresponding light-collecting means 69, 71.

As explained in detail with reference to specific examples in the foregoing, a plurality of optical devices 20, 22 are mounted on the same mounting surface of the single first die pad 2, whereby the interval d of the optical devices can be reduced, and the receiving surface and the emitting surface thereof for the optical signal are faced to one direction.

Since the lead frame 1 carrying the optical devices are also provided with a plurality of second die pads 4, 6, which are mounted with their respective circuit devices 30, 32, a mounting area required for a plurality of circuit devices electrically connected to the optical devices can be secured.

Further, by means of the connection lead groups 40, 42, the optical devices 20, 22 mounted on the first die pad 2 can be directly and electrically connected, within the lead frame, to the circuit devices 30, 32 mounted on the second die pads. The number of the groups 40, 42 is identical to the number of the second die pads 4, 6. Each of the groups 40, 42 comprises a plurality of connection leads 44, 48. Each connection lead group has one end disposed so as to face one side face of the first die pad 2 and the other end disposed so as to face one side face of the second die pad 4, 6. Consequently, the number of wiring leads can be reduced.

In addition, the connection lead groups 40, 42 are bent at their respective bent parts located at their predetermined positions, so that the rear faces opposite to the mounting surfaces of the two second die pads 4, 6 are oriented inward with respect to each other, whereby the two-dimensional size of the optical module can be reduced. Namely, the mounting density of the light-receiving device, light-emitting device, circuit devices, and the like can be enhanced.

(Second Embodiment)

FIG. 7 is a plan view of a major portion of the optical module lead frame in accordance with the second embodiment. Referring to FIG. 7, this lead frame 101 has a basic configuration similar to that of the first embodiment. Namely, the lead frame 101 comprises a planar first die pad 102, made of a electric conductive material, located at the center thereof; and two planar second die pads 104, 106, each made of a conductive material, disposed on both sides of the first die pad 102. The three die pads 102, 104, 106 are contained within the same plane and are arranged on a single line. The mounting surface of the first die pad 102 and the mounting surfaces of the second die pads 104, 106 coincide with one main surface of the lead frame 1. Further, the lead frame 101 has connection lead groups 140, 142, and wiring leads 154, 156, 158. The first and second connection lead groups 140, 142 have a plurality of conducting connection leads 144, 148, provided for electrically connecting the optical devices mounted on the first die pad, to the circuit devices mounted on the second die pads, and are included within the same plane as the first die pad 102 and second die pads 104, 106.

The lead frame 101 shown in FIG. 7 will not be explained in detail because it has substantially the same configuration as that of the lead frame 1 in the first embodiment except for the configuration concerning the directions in which the wiring leads 154, 156, 158 are drawn. Individual parts of the lead frame 101 in FIG. 7 are referred to with reference numbers produced by adding one hundred to the numbers indicating their corresponding parts of the lead frame 1 of FIG. 1, except for the reference numbers for the optical devices 10 and the circuit devices 30, 32 and the like.

Although a plurality of optical devices 10 and the like are mounted on the mounting surface of the first die pad 102, and the circuit devices 30, 32 electrically connected to the optical devices and the like are also mounted on the mounting surfaces of the second die pads 104, 106, respectively, as with the first embodiment, the configuration is not limited thereto.

Referring to FIG. 7, eight leads composed of the wiring leads 154, 156, 158 are arranged in one side of each of the second die pads 104, 106. The second pads 104, 106 are provided with a reference axis 108 extending vertically through both the side of each second die pad facing its corresponding connection lead group 140, 142 and its opposite side paired therewith. In the second die pad 104, the wiring leads 154, 156, 158 are arranged on one of the left and right sides (left side in FIG. 7) of the reference axis 108 provided in the second die pad 104. In the second pad 106, the wiring leads 154, 156, 158 are arranged on one of the left and right sides (right side in FIG. 7) of the reference axis 108 provided in the second die pad 106. In each second die pad 104, 106, the wiring leads 154, 156, 158 are oriented outward with respect to the reference axis 108. As with the first embodiment, each of the wiring leads 154, 156, 158 has an inner lead portion 152 and an outer lead portion 150, 151. The outer leads 150, 151 are directed, outward, to both sides perpendicular to the reference axis 108. In the outer leads, the outer leads 150 associated with the second die pad 104 are shorter than the outer leads 151 associated with the second die pad 106.

Figure 8A:
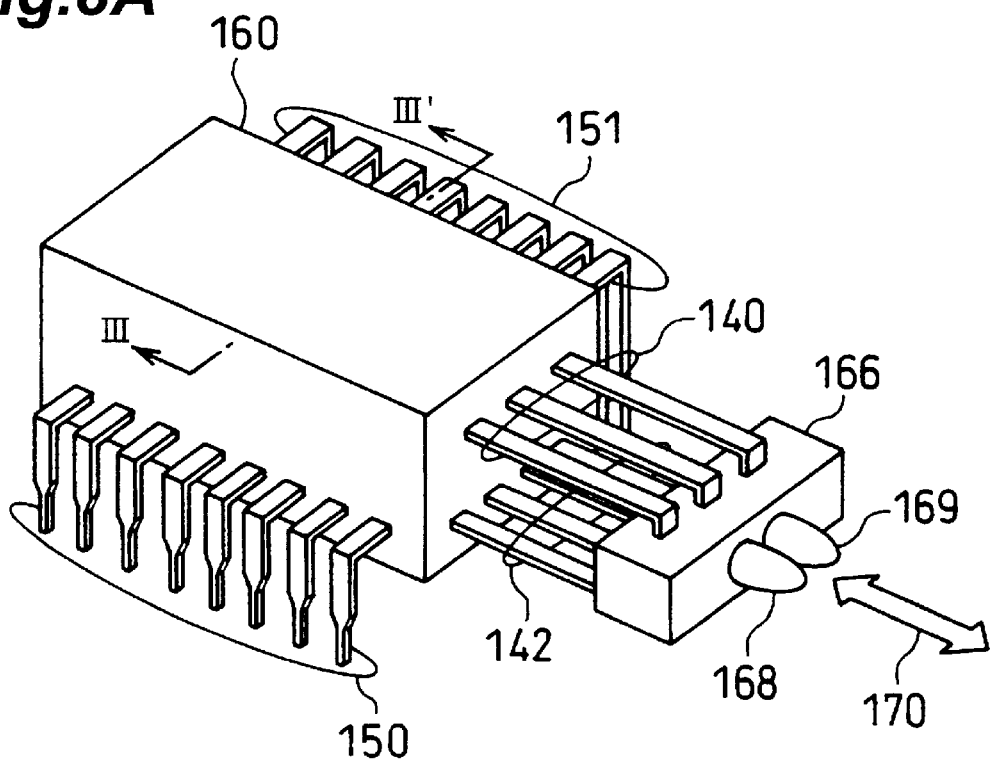
Figure 9A:
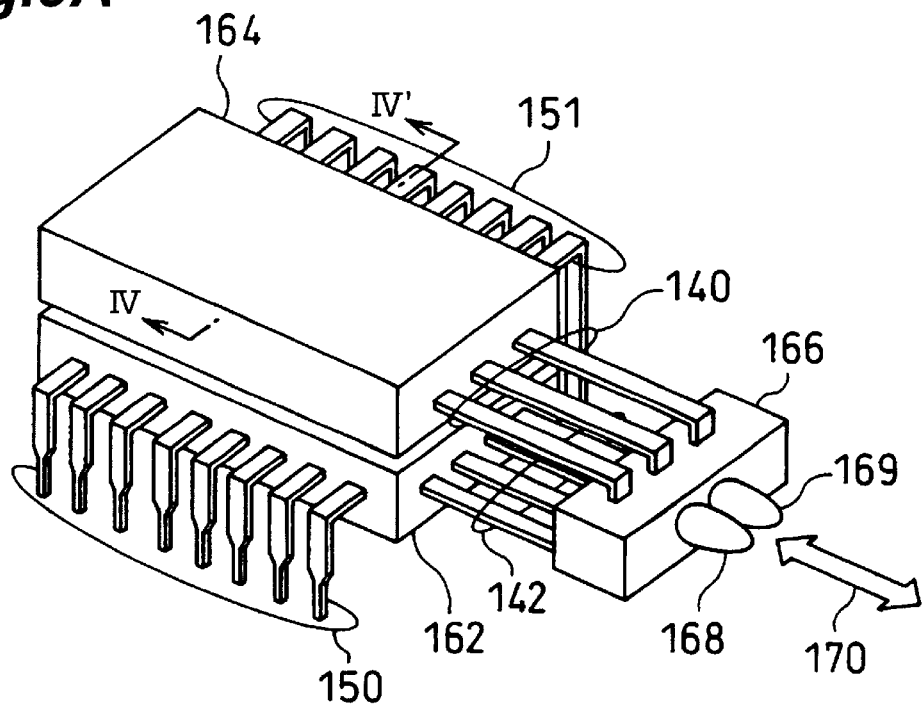

FIGS. 8A and 9A are perspective views of optical modules after the light-receiving device 20, light-emitting device 22, circuit devices 30, 34, and the like are mounted on their corresponding die pads 102, 104, 106 and are encapsulated with resin. Referring to FIGS. 8A and 9A, as with the first embodiment, an optical module in which the first die pad 102, light-receiving device 20, and light-emitting device 22 are molded with a single encapsulating resin body 166 is provided. On the optical axis 170 of signal light associated with the light-receiving device 20 and light-emitting device 22, light-collecting means 168, 169 for signal light such as condenser lens are provided by the form of the encapsulating resin body 166. As a consequence, it is not necessary to provide separated light-collecting means, and it is possible to provide an optical module in which the optical devices and the light-collecting means are arranged on the common optical axis. The encapsulating resin, the shape of the light-collecting means 68, and the like are not explained in detail because they are similar to those of the first embodiment.

Referring to FIG. 8A, as with the first embodiment, the second pads 104, 106, the circuit devices 30, 32 and the like are molded with a single encapsulating resin body 160 shaped like a rectangular parallelepiped form. Referring to FIG. 9A, as with the first embodiment, the second die pad 104 and the circuit device 30 and the like mounted thereon are encapsulated with a single encapsulating resin body 162 shaped like a rectangular parallelepiped form, whereas the second die pad 106 and the circuit device 32 mounted thereon and the like are molded with a different single encapsulating resin body 164. While thus encapsulated two semiconductor devices are completely overlaid on each other with a predetermined distance therebetween in the vertical direction of FIG. 9A, they do not or partly overlap each other depending on an angle formed between the side of the first die pad 102 facing the connection lead groups 140, 142 and the direction in which the connection lead groups 140, 142 extend. The predetermined distance is determined by the distance between the connection lead groups 140, 142 for connection with the optical device portions.

As with the first embodiment, in the lead frame 101 shown in FIGS. 8A and 8B and FIGS. 9A and 9B, the connection lead groups 140, 142 are bent substantially at the right angle at their respective positions near their corresponding sides of the first die pad 102, whereby the rear faces of the second die pads 104, 106 are oriented inward. As a consequence, the connection lead group 140 and the second die pad 104 are contained within one plane, the connection lead group 142 and the second die pad 106 are contained within the other plane, and these planes are substantially parallel to each other, while each of them is orthogonal to the plane including the mounting surface of the first die pad 102.

Figure 8B:
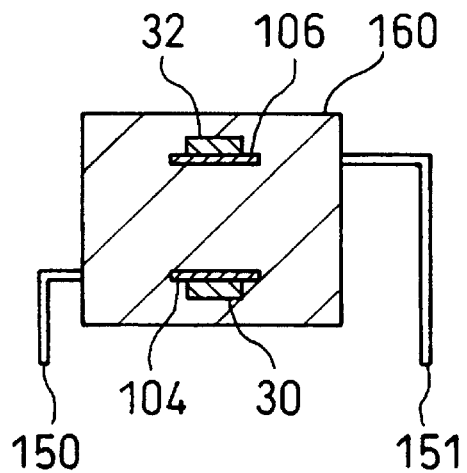
FIG. 8B is a sectional view taken along the section III–III' indicated in FIG. 8A.
Figure 9B:
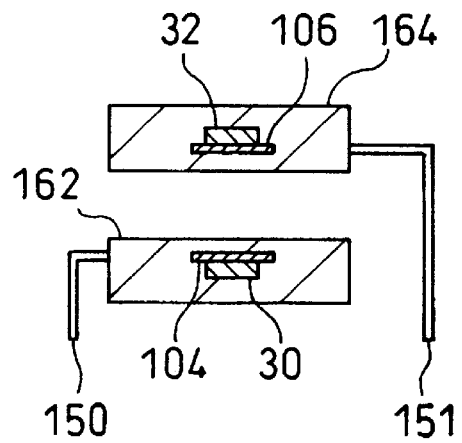
FIG. 9B is a sectional view taken along the section IV–IV' indicated in FIG. 9A.

FIG. 8B is a vertical sectional view taken along the section III–III' indicated in FIG. 9A, whereas FIG. 9B is a vertical sectional view taken along the section IV–IV' indicated in FIG. 9A. In FIGS. 8B and 9B, the outer leads 150, 151 in each cross section are illustrated in order to clarify the positional relationship between the die pads 104, 106 and the outer leads 150, 151.

In the outer leads 150, 151, since the outer leads 150 associated with the second die pad 104 are shorter than the outer leads 151 associated with the second die pad 106. When the outer leads 150 and 151 are bent in the same direction after encapsulation, the outer leads arranged on the same side of the molded body would not come into contact with each other, and the outer lead end positions substantially align with each other. Since the outer leads 150, 151 are disposed at two opposed sides, respectively, the bent parts of the shorter outer leads and the longer outer leads can be placed at substantially the same position. As a consequence, it becomes easier to bend the outer leads in each side. When the outer leads 150 and 151 are bent in the same direction after encapsulation, the lead ends are aligned in one row on each side face, and the outer lead end positions are substantially aligned with each other. The alignment makes it easy for the optical module to be mounted onto a printed circuit board or the like.

As explained in the foregoing, the optical module shown in FIG. 8A is configured such that, when a first plane is defined as a plain containing the mounting surface of the first die pad 102 mounting a plurality of optical devices, a second plane is defined as a plain containing the mounting surface of the second die pad 104 mounting a circuit device electrically connected to at least one optical device, and a third plane is defined as a plain containing the mounting surface of the third die pad 106 mounting a circuit device electrically connected to at least one optical device, then the three plains have the relationship as follows: the second plane and the third plane are substantially parallel to each other; the second and third planes are substantially orthogonal to the first plane; and the rear face opposite to the mounting surface of the second die pad 104 faces the rear face opposite to the mounting surface of the second die pad 106. The first die pad 102 and the optical devices are encapsulated with the encapsulating resin body 166, whereas the second die pads 104, 106 and the light-emitting device and light-receiving device 20, 22 are molded with the encapsulating resin body 160. The connection lead groups 140, 142 extend from the encapsulating resin body 166 while being contained within the first plane. The connection lead groups 140, 142 are bend substantially at the right angle at the respective positions at which the groups 140, 142 intersect the second and third planes, so that the groups 140, 142 are contained within the second and third planes, respectively, and reach one side of the encapsulating resin body 160 so as to be connected with the inner leads. The outer leads 150 are contained within the third plane and extend to one of the leftward and rightward directions (leftward in FIG. 8A) orthogonal to the direction in which the connection lead groups 140, 142 extend. The outer leads 151 are contained within the second plane and extend to one of the leftward and rightward directions (rightward in FIG. 8A) orthogonal to the direction in which the connection lead groups 140, 142 extend. The outer leads 150, 151 are bent substantially at the right angle, all in the same direction, at their respective predetermined position near their corresponding sides of the encapsulating resin body 160. The optical module shown in FIG. 9A has a configuration similar to that of FIG. 8A except that the second die pad 104 and the circuit device 30 are encapsulated with the encapsulating resin body 162, and that the second die pad 106 and the circuit device 32 are encapsulated with the encapsulating resin body 164.

Thus, as with the first embodiment, the distance d of the optical devices can be reduced, the direction of the emitting surfaces for the optical signal coincides with that of the receiving surface, and a mounting area required for a plurality of circuit devices can be secured. The connection lead groups 140, 142, the number of which is identical to that of the second die pads 104, 106, are provided, and each connection group has a plurality of connection leads 144, 148, whereby the number of wiring leads can be reduced. In addition, since the connection lead groups 140, 142 are bent substantially at the right angle at their predetermined positions, so that the rear faces opposite to the mounting surfaces of the two second die pads 104, 106 are oriented inward with respect to each other. The optical module can be reduced in the two-dimensional size, whereby the mounting density of the devices can be enhanced.

(Third Embodiment)

Figure 10:
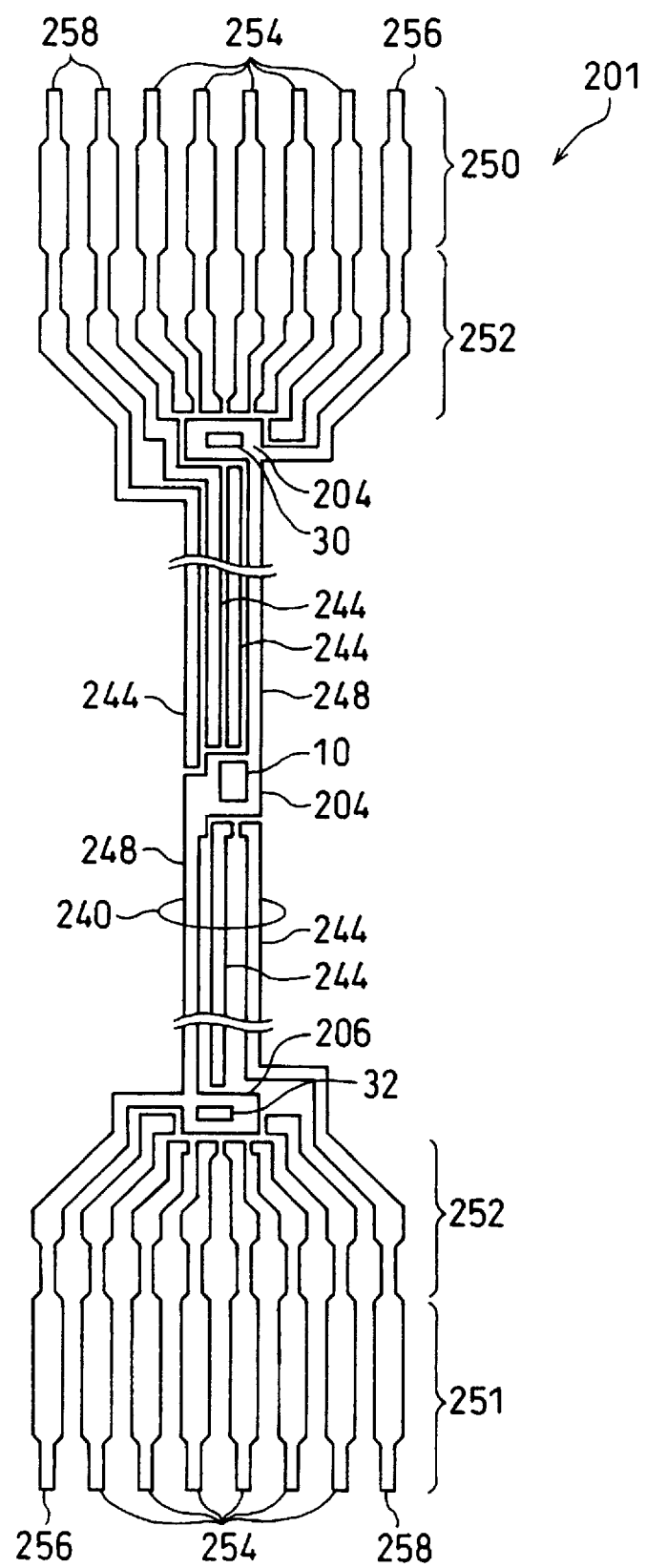
FIG. 10 is a plan view of a major portion of the optical module lead frame in accordance with a third embodiment.

FIG. 10 is a plan view of a major portion of the optical module lead frame 201 in accordance with the embodiment. The lead frame 201 shown in FIG. 10 will not be explained in detail because it has substantially the same configuration as that of the lead frame 101 in the second embodiment except for the configuration concerning the directions in which wiring leads 254, 256, 258 are drawn. Individual parts of the lead frame 101 in the second embodiment and their corresponding parts of the lead frame 201 in the third embodiment are referred to with reference numerals whose lower two digits are common in FIGS. 7 and 10, except for the optical devices 10 and the circuit devices 30, 32, and the like.

Figure 11A:
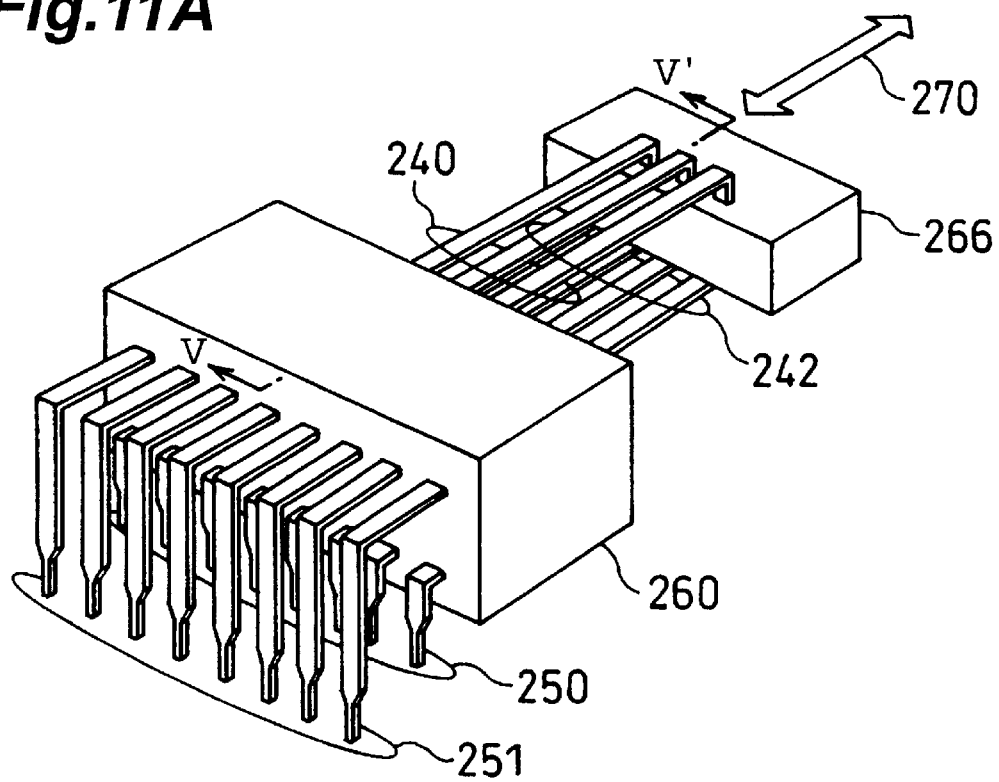
Figure 12A:
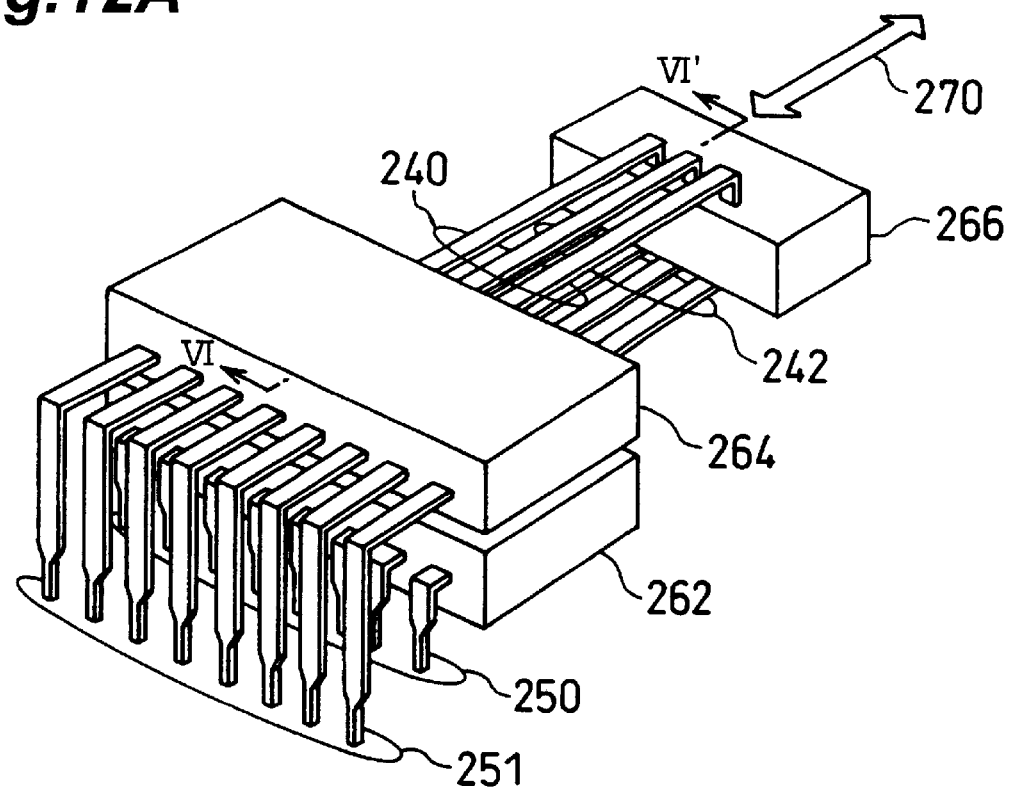

FIGS. 11A and 12A are perspective views of optical module in which the light-receiving device 20, light-emitting device 22, circuit devices 30, 32, and the like are mounted on their corresponding die pads 202, 204, 206 and encapsulated with resin. Referring to FIGS. 11A and 12A, as with the second embodiment, an optical module in which the first die pad 202, light-receiving device 20, and light-emitting device 22 are integrally encapsulated with an encapsulating resin body 266 is provided. Unlike the first and second embodiments, depicted are the optical module having the flat surface of the resin body on the optical axis 270 of signal light associated with the light-receiving device 20 and light-emitting device 22 without specific light-collecting means for signal light. The encapsulating resin and the like are not explained in detail because they are similar to those of the second embodiment.

Referring to FIG. 11A, as with the second embodiment, the second pads 204, 206 and the circuit devices 30, 32 and the like are encapsulated with a single encapsulating resin body 260 shaped in a rectangular parallelepiped form. Referring to FIG. 12A, as with the second embodiment, the second die pad 204 and the circuit device 30 mounted thereon or the like are encapsulated with a single encapsulating resin body 262 shaped in a rectangular parallelepiped form, whereas the second die pad 206 and the circuit device 32 or the like mounted thereon are encapsulated with a different single encapsulating resin body 264. Thus encapsulated two semiconductor devices are arranged so as to be vertically overlaid on each other with a predetermined distance therebetween.

As with the above-mentioned embodiments, in the lead frame 201 shown in FIGS. 11A and 11B and FIGS. 12A and 12B, the connection lead groups 240, 242 are bent substantially at right angles at their respective positions near their corresponding side faces of the first die pad 202, whereby the rear faces opposite to the mounting surfaces of the second die pads 204, 206 are oriented inward with respect to each other. As a consequence, the connection lead group 240 and the second die pad 204 are contained within one plane, the connection lead group 242 and the second die pad 206 are also contained within the other plane. These planes are substantially parallel to each other, while each of them is orthogonal to the plane containing the mounting surface of the first die pad 202.

Figure 11B:
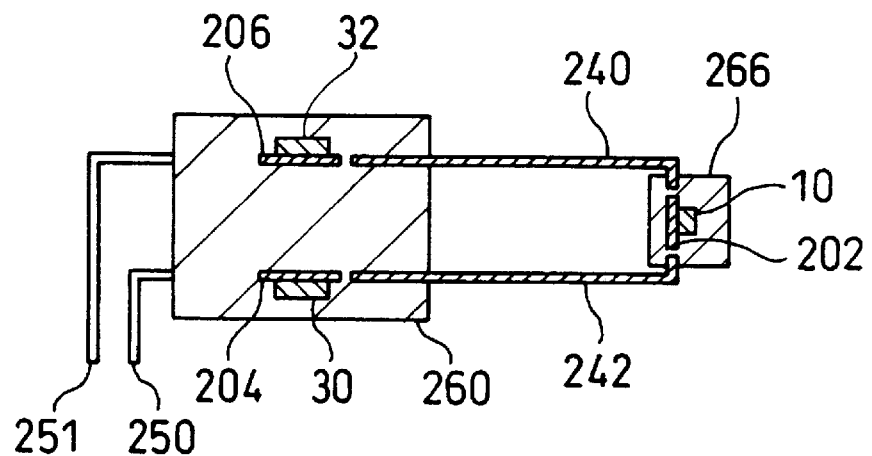
FIG. 11B is a sectional view taken along the section V–V' indicated in FIG. 11A.
Figure 12B:
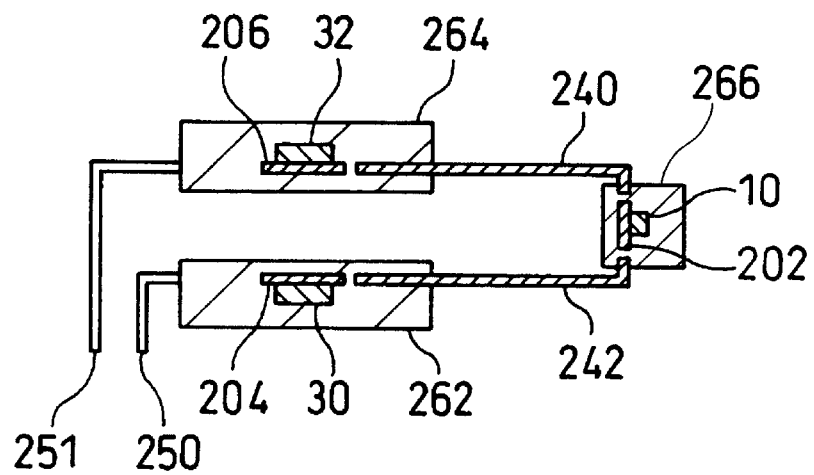
FIG. 12B is a sectional view taken along the section VI–VI' indicated in FIG. 12A.

FIG. 11B is a vertical sectional view taken along the section V–V' indicated in FIG. 11A, whereas FIG. 12B is a vertical sectional view taken along the section VI–VI' indicated in FIG. 12A. FIGS. 11B and 12B illustrate the outer leads 250, 251 in each cross section in order to clarify the positional relationship between the die pads 204, 206 and the outer leads 250, 251.

In the outer leads 250, 251, the outer leads 250 associated with the second die pad 204 are shorter than the outer leads 251 associated with the second die pad 206. If the position of the bent parts of the shorter outer leads is located inside the position of the bent parts of the longer outer leads, then the ends of the shorter outer leads are placed on the inner side, and the ends of the longer outer leads are placed on the outer side, so that these lead ends are aligned in two rows on each side. Therefore, even when the outer leads 250 and 251 are bent in the same direction after encapsulation, the outer leads disposed in the same side face would not come into contact with each other, and the outer lead end positions substantially are aligned with each other, The alignment allows the easy mounting of the optical module on a printed circuit board or the like.

As explained in the foregoing, the optical module shown in FIG. 11A has a configuration in terms of the relationship among a first plane, a second plane, and a third plane as described below: the first plane includes the mounting surface of the first die pad 202 mounting a plurality of optical devices; a second plane includes the mounting surface of the second die pad 204 mounting a circuit device electrically connected to at least one optical device; and a third plane includes the mounting surface of the third die pad 206 mounting a circuit device electrically connected to at least one optical device. The configuration is described below: the second plane and the third plane are substantially parallel to each other; and the second and third planes are substantially orthogonal to the first plane. The rear face opposite to the mounting surface of the second die pad 204 faces that of the second die pad 206. The first die pad 102 and the optical devices are encapsulated with the encapsulating resin body 266, whereas the second die pads 204, 206, the light-receiving device 20 and the light-emitting devices 22 are encapsulated with the encapsulating resin body 260. The connection lead groups 240, 242 extend from the encapsulating resin body 266 while being contained within the first plane. The groups 140, 142 bend substantially at the right angle at the respective positions at which the groups 140, 142 intersect the second and third planes, respectively, so as to be contained within the second and third planes, and reach one side of the encapsulating resin body 260 so as to be connected with the inner leads. The outer leads 250 are contained within the third plane, whereas the outer leads 251 are contained within the second plane. The outer leads 250, 251 are arranged only at the rear face opposite to the side of the encapsulating resin body 260 faced to the encapsulating resin body 266, and also extend in the directions in which the connection lead groups 240, 242 extend, respectively. The outer leads 250, 251 are bent substantially at the right angle, all in one direction, at their respective predetermined position near their corresponding side of the encapsulating resin body 260. The optical module shown in FIG. 12A has a configuration similar to that of FIG. 11A except that the second die pad 204 and the circuit device 30 are molded with the encapsulating resin body 262 and the second die pad 206 and the circuit device 32 are encapsulated with the encapsulating resin body 264.

Thus, as with the second embodiment, the interval d of the optical devices can be reduced, the direction of the emitting surface for the optical signal coincide with that of the receiving surface, and a mounting area required for a plurality of circuit devices 30, 32 can be secured. The number of the connection lead groups 240, 242 is identical to that of the second die pads 204, 206, whereby the number of wiring leads can be reduced. Also, the connection lead groups 240, 242 are bent substantially at the right angle at their predetermined positions, so that the rear faces of the two second die pads 204, 206 are oriented inward with respect to each other. The optical module can be reduced in two-dimensional size, whereby the mounting density of the devices and the like can be increased.

(Fourth Embodiment)

Figure 13:
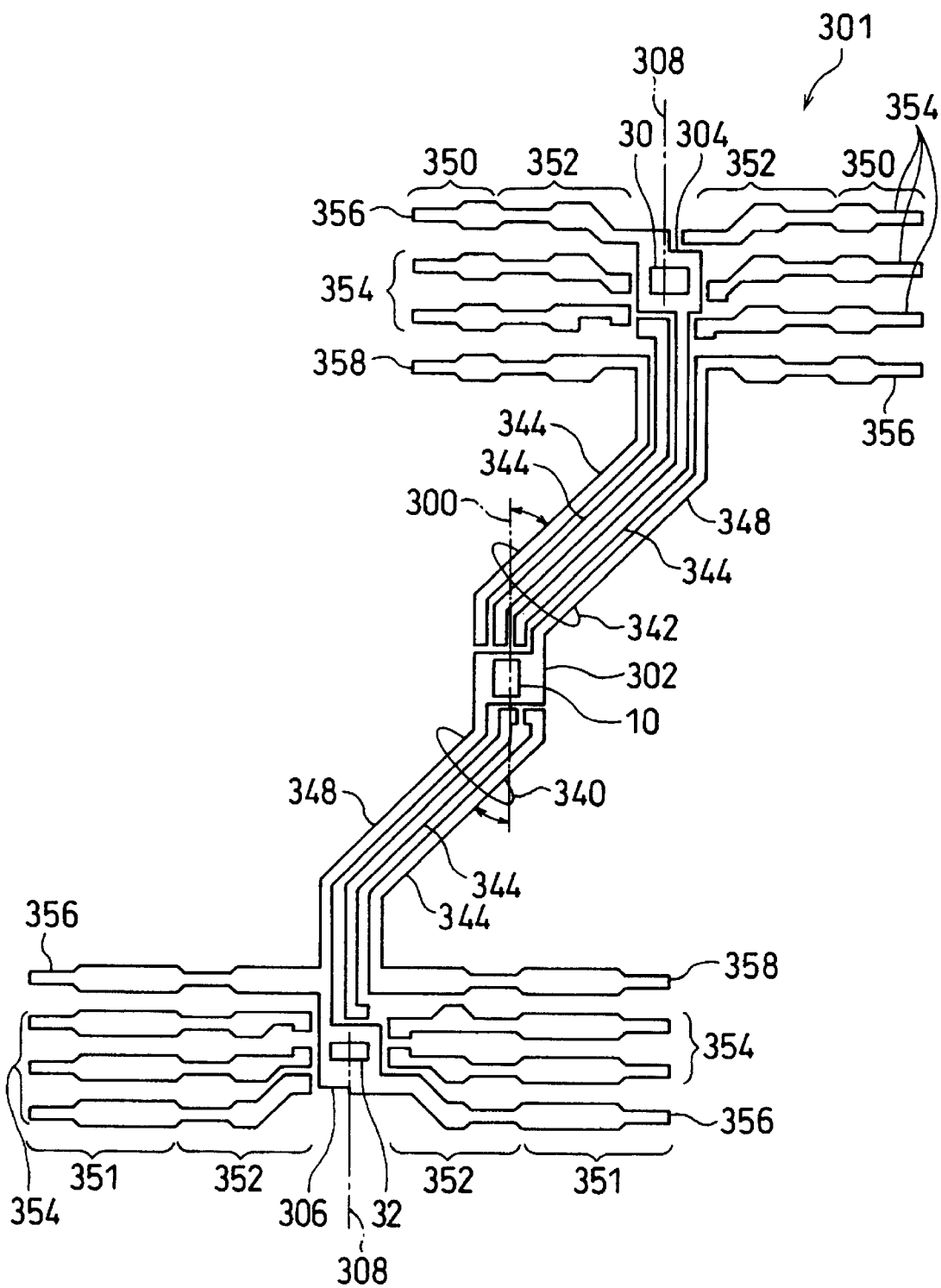
FIG. 13 is a plan view of a major portion of the optical module lead frame in accordance with a fourth embodiment.

FIG. 13 is a plan view of a major portion of the optical module lead frame 301 in accordance with the fourth embodiment. The lead frame 301 shown in FIG. 13 will not be explained in detail because it has substantially the same configuration as those of the lead frame 1 in the first embodiment except for directions in which wiring leads 354, 356, 358 are drawn. Individual parts of the lead frame 301 in FIG. 13 are referred to with reference numbers produced by adding three hundreds to the numbers of their corresponding parts in the lead frame 1 in FIG. 1 except for the optical devices 10, the circuit devices 30, 32 and the like.

Referring to FIG. 13, the lead frame 301 has connection lead groups 340, 342 and wiring leads 354, 356, 358 in addition to the first and second die pads 302, 304, 306. The first connection lead group 340 is provided such that one end thereof faces one side of the substantially rectangular first die pad 302 (on the upper side of the first die pad 302 in the drawing), and the other end thereof faces one side of the second die pad 304 (on the lower side of the second die pad 304 in the drawing.) The second connection lead group 342 is provided such that one end thereof faces one side face of the substantially rectangular first die pad 302 (on the lower side of the first die pad 302 in the drawing), and the other end thereof faces one side face of the second die pad 306 (on the upper side of the second die pad 306 in the drawing). The first and second connection lead groups 340, 342 have a plurality of conductive connection leads 344, 348 provided for electrically connecting the optical devices mounted on the first die pad 302 to the circuit devices mounted on the second die pads 304, 306, and are arranged in the same plane as the first die pad 302 and the second die pads 304, 306.

The first die pad 302 is sandwiched between second die pads 304, 306, and the first die pad 302 and the second die pads 304, 306 are arranged on a single line. The connection lead groups 340, 342 are arranged so as to face a pair of opposed sides of the first die pad 302, respectively, whereas the second die pads 304, 306 face the respective surfaces including the pair of sides. The connection lead groups 340, 342 extend along a reference axis 300 extending vertically through the pair of the above-mentioned two opposed sides, i.e., in a direction perpendicular to one side of the die pad 302 (the vertical direction in the drawing.) The connection lead group 340 bends at its first position toward one of the left and right sides of the reference axis 300 at a predetermined angle, whereas the connection lead group 342 bends at its first position toward the other of the left and right sides of the reference axis 300 at the same angle. The connection lead groups 340, 342 bend at their respective second positions, which are different from the first positions, so as to extend parallel to the reference axis 300 and reach their respective sides of the second die pads 304, 306. The predetermined angle is greater than 0 degrees but smaller than 90 degrees.

Figure 14A:
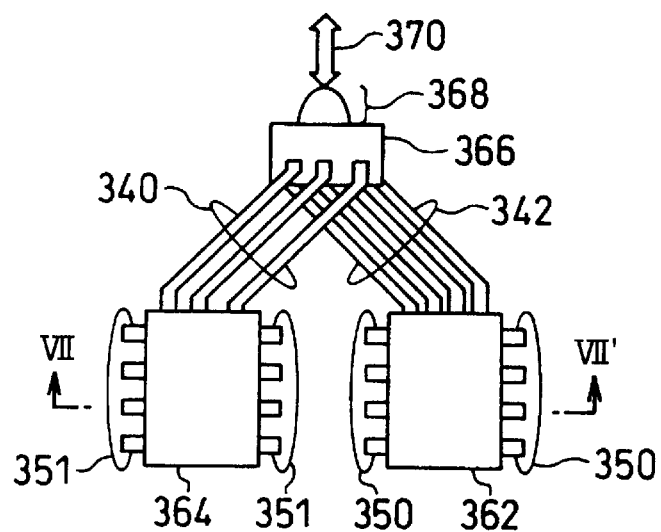
FIG. 14A is a top plan view of an optical module encapsulated with a molding resin.
Figure 14B:
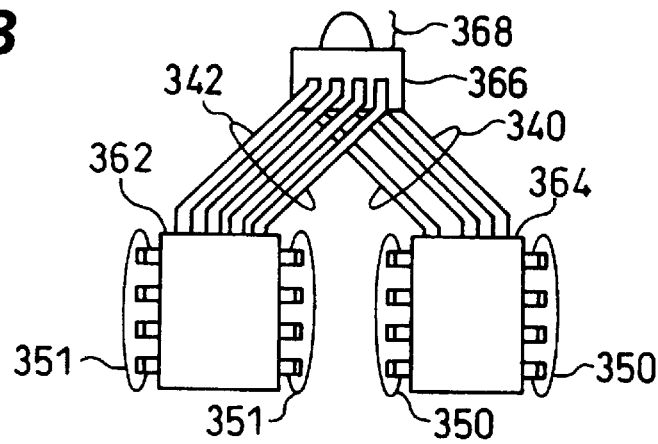
FIG. 14B is a bottom view of the optical module.
Figure 14C:
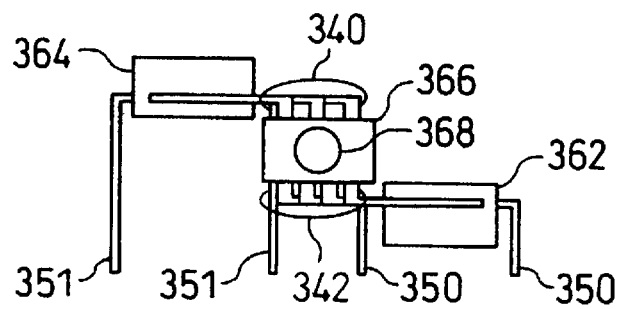
FIG. 14C is a front view of the optical module.
Figure 14D:
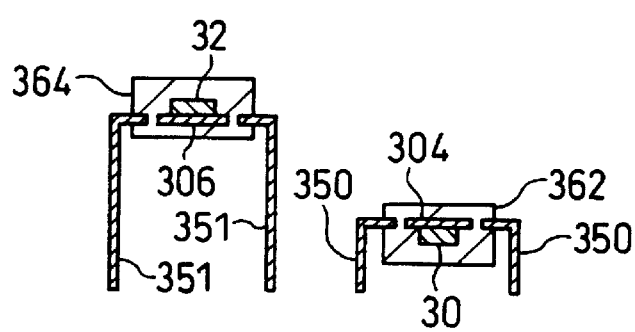
FIG. 14D is a sectional view taken along the section VII–VII' indicated in FIG. 14A.
Figure 15:
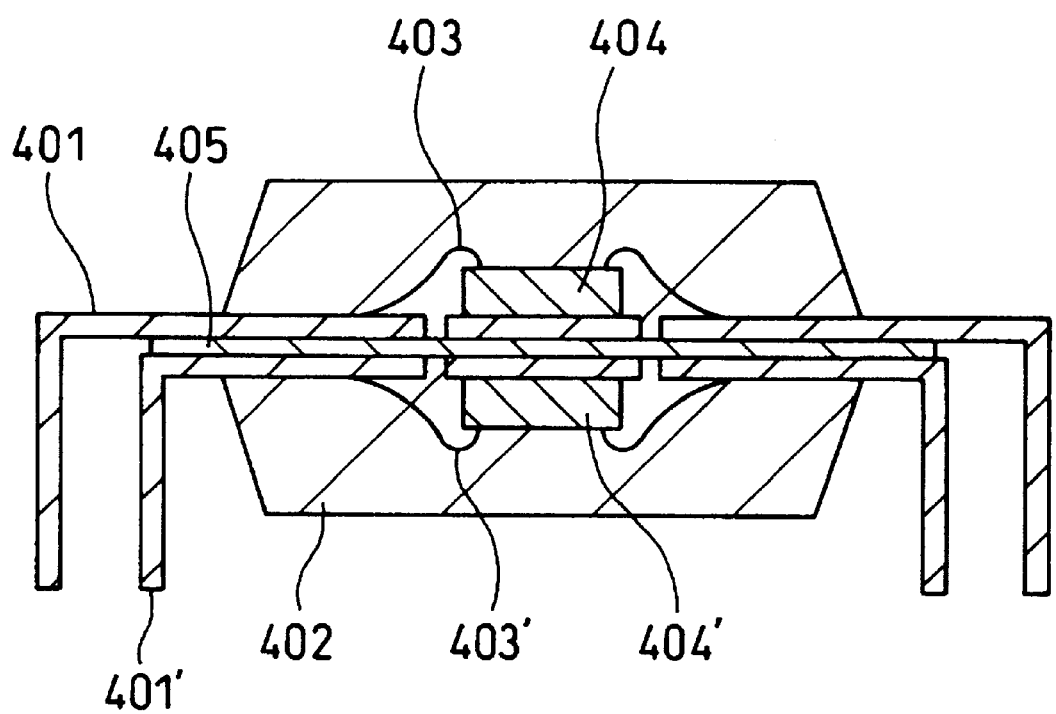
FIG. 15 is a sectional view of a semiconductor assembly in the prior art.

FIG. 14A is a top plan view of an optical module in which devices 10, 20, 22 and the like are provided on the optical module lead frame 301 shown in FIG. 13 and encapsulated with an encapsulating resin. FIG. 14B is a bottom view thereof. FIG. 14C is a front view thereof. FIG. 14D is a sectional view taken along the section VII–VII' indicated in FIG. 14A. Here, FIG. 14D shows only the parts appearing in the cross section.

Referring to FIGS. 14A to 14C, as with the first embodiment, an optical module in which the first die pad 302, the light-receiving device 20, and the light-emitting device 22 are integrally encapsulated with an encapsulating resin body 366 is provided. On the optical axis 370 of signal light associated with the light-receiving device 20 and light-emitting device 22, a condenser lens for signal light is formed by the form of the encapsulating resin body 366. The second die pad 304 and the circuit device 30 or the like mounted thereon are molded with a single encapsulating resin body 362 shaped in a rectangular parallelepiped form, whereas the second die pad 306 and the circuit device 32 mounted thereon or the like are molded with a different single encapsulating resin body 364. Referring to FIG. 14D, two encapsulated members 362, 364 are arranged without vertically overlapping each other. The respective heights of the members 362, 364 differ from each other by the distance between the connection lead groups 340, 342 for connection with the optical device portion.

As with the first embodiment, the lead frame 301 as shown in FIGS. 14A to 14D is bent substantially at the right angle at respective positions near the sides of the first die pad 302, while the rear faces opposite to the mounting surfaces of the second die pads 304, 306 are faced inward. As a consequence, the connection lead group 340 and the second die pad 304 are contained within one plane, the connection lead group 342 and the second die pad 306 are contained within the other plane, and these planes are substantially parallel to each other, while each of them is orthogonal to the plane including the mounting surface of the first die pad 302.

FIGS. 14C and 14D also show the outer leads 350, 351 so as to clarify the positional relationship between the die pads 304, 306 and the outer leads 350, 351.

As for the outer leads 350, 351, the outer leads 350 associated with the second die pad 304 are shorter than the outer leads 351 associated with the second die pad 306, whereby the outer lead end positions substantially are aligned with each other when the outer leads 350, 351 are bent substantially at the right angle in the same direction after encapsulation.

Since the outer leads 350, 351 extend from the encapsulating resin bodies 362, 364 arranged in parallel, respectively, the bent part of the shorter outer leads and the bent part of the longer outer leads can be placed substantially at the same position. As a consequence, when the outer leads 350 and 351 are bent in the same direction after encapsulation, the lead ends in each side align in one row. Hence, the outer leads arranged on the same side can be bent easily, and the outer lead end positions substantially align with each other, whereby mounting onto a printed circuit board or the like becomes easier.

As explained in the foregoing, the optical module shown in FIGS. 14A to 14D has a configuration in terms of the relationship among a first plain, a second plain, and a third plain: the first plane includes the mounting surface of the first die pad 302 mounting a plurality of optical devices; the second plane includes the mounting surface of the second die pad 304 mounting a circuit device electrically connected to at least one optical device; and the third plane includes the mounting surface of the third die pad 306 mounting a circuit device electrically connected to at least one optical device. The configuration is as follows: the second and third planes are substantially orthogonal to the first plan; the second plane and the third plane are substantially parallel to each other; and the rear face of the second die pad 304 and the rear face of the second die pad 306 face inward with respect to each other. The first die pad 302 and the optical devices are encapsulated with the encapsulating resin body 366. The second die pad 304 and the circuit device 30 are encapsulated with the encapsulating resin body 362. The second die pad 306 and the circuit device 32 are encapsulated with the encapsulating resin body 364. The connection lead groups 340, 342 extend from the encapsulating resin body 366 while being included in the first plane. The connection lead group 340 bends substantially at the right angle at a position where the group 340 intersects the second plane, extends while being contained in the second plane, reaches one side of the encapsulating resin body 362, and connects with the inner leads 352. The connection lead group 342 bends substantially at the right angle at a position where the group 342 intersects the third plane, extends while being contained within the third plane, reaches one side of the encapsulating resin body 364, and connects with the inner leads 352. The outer leads 350 are contained within the second plane, whereas the outer leads 351 are contained within the third plane. The outer leads 350, 351 extend both leftward and rightward of the respective axes extending vertically through both the surfaces of the encapsulating resin bodies 362, 364 facing the encapsulating resin body 366 and their opposed surfaces. These leads 350, 351 bend substantially at the right angle, all in one direction, at their predetermined positions near the corresponding sides of the encapsulating resin bodies 362, 364.

Thus, as with the first embodiment, the interval d of the optical devices can be reduced, the emitting surface and receiving surface thereof for the optical signal are allowed to face to the same direction, and a mounting area required for a plurality of circuit devices can be secured. The number of the connection lead groups 340, 342 is identical to that of the second die pads 304, 306, each of the groups 340, 342 has a plurality of connection leads 344, 348, whereby the number of wiring leads can be reduced. Also, since the connection lead groups 340, 342 are bent substantially at the right angle at their predetermined positions, so that the rear faces of the two second die pads 304, 306 are oriented inward with respect to each other, the two-dimensional size of the optical module can be reduced, whereby the mounting density of the devices and the like can be enhanced.

Industrial Applicability

As explained in detail in the foregoing, a plurality of optical devices are provided on a single first die pad of the optical module in accordance with the present invention, whereby the interval of the optical devices can be reduced, and the direction of the emitting surface for the optical signal can coincide with that of the receiving surface. Also, the lead frame provided with the optical devices comprises a plurality of second die pads, each of 51, which can be mounted with their circuit devices, whereby an area for mounting a plurality of circuit devices can be secured. Further, the number of the connection lead groups is identical to that of the second die pads. Each of the connection lead groups comprises a plurality of connection leads, each of which has one end provided so as to face one side of the first die pad and the other end provided so as to face one side of the second die. The connection lead groups allows the optical devices mounted on the first die pad to be directly connected to the circuit devices mounted on the second die pads. As a consequence, the number of wiring leads can be reduced. Hence, it is possible to provide an optical module in which a plurality of optical devices are integrally mounted and molded, whereby the mounting density of the devices and the like can be enhanced.

The optical module lead frame in accordance with the present invention has a single first die pad for mounting a plurality of optical devices, whereby it allows the optical devices to be arranged with the reduced interval thereof, and also allows the emitting surface and the receiving surface for the optical signal to face to the same direction. Also, the lead frame provided with the optical devices comprises a plurality of second die pads provided for mounting the circuit devices corresponding to the respective optical devices, whereby a mounting area for a plurality of circuit devices can be secured. Further, the lead frame comprises the connection lead groups for directly electrically connecting the optical devices mounted on the first die pad to the circuit devices mounted on the second die pads. The number of the groups is identical to that of the second die pads. Each of the groups comprises a plurality of connection lead. Each of the connection leads has one end arranged so as to face one side of the first die pad and the other end arranged so as to face one side of the second die. Therefore, the number of wiring leads can be reduced.

Hence, it is possible to provide an optical module, having a plurality of circuit devices, in which a plurality of optical devices can be integrally mounted and molded, and a lead frame for the optical module. They are suitable for attaining the smaller size and the higher density thereof.

What is claimed is:

1. An optical module comprising:

optical devices including one of a semiconductor light-receiving device and a semiconductor light-emitting device, said semiconductor light-receiving device being provided so as to receive an optical signal, convert thus received optical signal into an electric signal, and output thus obtained electric signal, and said semiconductor light-emitting device being provided so as to receive an electric signal, convert thus received electric signal into an optical signal, and emit thus obtained optical signal;

semiconductor circuit devices, electrically coupled to said optical devices, provided so as to process said electric signal;

a lead frame mounting said optical devices and said semiconductor circuit device thereon; and a first encapsulating resin body, transparent to light of the optical signal processed by said optical devices, provided so as to encapsulate said optical devices;

wherein said lead frame has a single first die pad provided so as to mount a plurality of said optical devices; a plurality of second die pads provided so as to mount a plurality of said semiconductor circuit devices respectively; connection lead groups provided so as to electrically connect the optical device mounted on said first die pad to said semiconductor circuit devices mounted on said second die pads, the number of said connection lead groups being identical to the number of said second die pads, said connection lead groups each having a plurality of connection leads, and said connection lead groups each having one end arranged so as to face one side of said first die pad and the other end arranged so as to face one side of said second die pad; and wiring leads arranged so as to face a side of said second die pads; and wherein said optical devices is electrically connected to said wiring leads by way of said connection leads.

2. An optical module according to claim 1, wherein said lead frame has two said second die pads, said connection lead groups being arranged so as to face a pair of two sides of said first die pad, respectively; said connection lead groups each having a bent portion bent substantially at the right angle at a predetermined position thereof such that the respective rear faces opposite to the mounting surfaces of said second die pads are oriented to face each other.

3. An optical module according to claim 1, wherein said first encapsulating resin has light-collecting means, said light-collecting means being provided on optical axes of the signal light associated with said optical devices.

4. An optical module according to claim 2, further comprising a second encapsulating resin body provided so as to integrally encapsulating said semiconductor circuit devices mounted on said respective second die pads.

5. An optical module according to claim 2, further comprising second encapsulating resin bodies provided so as to separately encapsulate said semiconductor circuit devices mounted on said respective second die pads.

6. An optical module according to claim 1, wherein said optical devices are arranged on said first die pad such that the optical axes of said optical devices is conformed to a core interval of adjacent optical fibers in a ribbon fiber cable.

7. A lead frame for an optical lead frame provided so as to arrange optical devices and semiconductor circuit devices thereon, wherein the optical devices includes at least one of a semiconductor light-receiving device for receiving an optical signal, converting thus received optical signal into an electric signal, and outputting thus obtained electric signal, and the semiconductor light-emitting device for receiving an electric signal, converting thus received electric signal into an optical signal, and emitting thus obtained optical signal; and wherein the semiconductor circuit devices for processing said electric signal being provided so as to be electrically connected to said optical devices; said lead frame comprising:

a single first die pad provided so as to arrange said optical devices;

a plurality of second die pads provided so as to arrange said semiconductor circuit devices;

connection lead groups provided so as to electrically connect the optical devices mounted on said first die pad to the semiconductor circuit devices mounted on said second die pads, respectively, said connection lead groups each having a plurality of connection leads, said connection lead groups each having one end arranged so as to face one side of said first die pad and the other end arranged so as to face one side of said second die pad, and the number of said connection lead groups being identical to the number of said second die pads; and a plurality of wiring leads provided so as to electrically connect said semiconductor circuit devices and said optical devices to outside, the plurality of wiring leads facing sides of said second die pads.

8. A lead frame according to claim 7, wherein said second die pads are two, said connection lead groups each having a part to be bent substantially at the right angle, said connection lead groups being arranged so as to face a pair of two sides of said first die pad, said second die pads facing respective faces including said pair of two sides of said first pad, said second die pads being arranged on a axis with said first die pad sandwiched therebetween.

9. A lead frame according to claim 8, wherein said second die pads have reference axes extending through both sides of the second die pads facing said connection lead groups and opposite sides paired therewith, said wiring leads being arranged so as to face the left and right sides of said reference axes.

10. A lead frame according to claim 8, wherein said second die pads have reference axes extending through both sides of said second die pads facing said connection lead groups and opposite sides paired therewith, said wiring leads being arranged so as to face one of the left and right sides of the reference axis in one of said second die pads, said wiring leads is arranged so as to face the other of the left and right sides of the reference axis in the other of said second die pads.

11. A lead frame according to claim 8, wherein said wiring leads are arranged so as to face sides of said second die pads, said sides thereof being opposite to sides thereof on which said second die pads face said first die pad.

* * * * *

UNITED STATES PATENT AND TRADEMARK OFFICE
CERTIFICATE OF CORRECTION

PATENT NO. : 6,157,050
DATED : December 5, 2000
INVENTOR(S) : Takashi FUKUOKA

It is certified that error appears in the above-identified patent and that said Letter Patent is hereby corrected as shown below:

In the Claims:

Claim 7, line 1, delete "lead frame" and insert --module--.

Signed and Sealed this

First Day of May, 2001

Attest:

NICHOLAS P. GODICI

*Attesting Officer*   *Acting Director of the United States Patent and Trademark Office*